United States Patent
Shalvi et al.

(10) Patent No.: US 8,239,735 B2
(45) Date of Patent: Aug. 7, 2012

(54) MEMORY DEVICE WITH ADAPTIVE CAPACITY

(75) Inventors: Ofir Shalvi, Ra'anana (IL); Dotan Sokolov, Ra'anana (IL); Ariel Maislos, Sunnyvale, CA (US); Zeev Cohen, Zichron-Yaakov (IL); Eyal Gurgi, Petah-Tikva (IL); Gil Semo, Tel-Aviv (IL)

(73) Assignee: Apple Inc., Cupertino, CA (US)

( * ) Notice: Subject to any disclaimer, the term of this patent is extended or adjusted under 35 U.S.C. 154(b) by 1197 days.

(21) Appl. No.: 12/063,544

(22) PCT Filed: May 10, 2007

(86) PCT No.: PCT/IL2007/000579
§ 371 (c)(1),
(2), (4) Date: Feb. 11, 2008

(87) PCT Pub. No.: WO2007/132456
PCT Pub. Date: Nov. 22, 2007

(65) Prior Publication Data
US 2010/0157641 A1    Jun. 24, 2010

Related U.S. Application Data

(60) Provisional application No. 60/747,106, filed on May 12, 2006, provisional application No. 60/822,236, filed on Aug. 13, 2006, provisional application No. 60/825,913, filed on Sep. 17, 2006, provisional application No. 60/866,071, filed on Nov. 16, 2006, provisional application No. 60/866,860, filed on Nov. 22, 2006, provisional application No. 60/867,399, filed on Nov. 28, 2006, provisional application No. 60/871,838, filed on Dec. 26, 2006, provisional application No. 60/882,240, filed on Dec. 28, 2006, provisional application No. 60/883,071, filed on Jan. 2, 2007, provisional application No. 60/885,987, filed on Jan. 22, 2007.

(51) Int. Cl.
*G06F 11/00* (2006.01)

(52) U.S. Cl. ........................................................ 714/774

(58) Field of Classification Search .................. 714/763, 714/774; 365/45, 230.03, 218
See application file for complete search history.

(56) References Cited

U.S. PATENT DOCUMENTS 3,668,631 A    6/1972    Griffith et al.
(Continued)

FOREIGN PATENT DOCUMENTS

EP    0783754 B1    7/1997
(Continued)

OTHER PUBLICATIONS

STMicroelectronics, May 2004, Aplication Note AN1819 titled: "Bad Block Management in NAND Flash Memories" ver. 1.*

(Continued)

*Primary Examiner* — Scott Baderman
*Assistant Examiner* — Yair Leibovich
(74) *Attorney, Agent, or Firm* — Meyertons, Hood, Kivlin, Kowert & Goetzel, P.C.

(57) ABSTRACT

A method for data storage in a memory (28) that includes a plurality of analog memory cells (32) includes estimating respective achievable storage capacities of the analog memory cells. The memory cells are assigned respective storage configurations defining quantities of data to be stored in the memory cells based on the estimated achievable capacities. The data is stored in the memory cells in accordance with the respective assigned storage configurations. The achievable storage capacities of the analog memory cells are re-estimated after the memory has been installed in a host system and used for storing the data in the host system. The storage configurations are modified responsively to the re-estimated achievable capacities.

110 Claims, 10 Drawing Sheets

U.S. PATENT DOCUMENTS

| | | | |
|---|---|---|---|
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |
| 4,558,431 A | 12/1985 | Satoh | |
| 4,608,687 A | 8/1986 | Dutton | |
| 4,654,847 A | 3/1987 | Dutton | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotta et al. | |
| 5,182,558 A | 1/1993 | Mayo | |
| 5,182,752 A | 1/1993 | DeRoo et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,446,854 A | 8/1995 | Khalidi et al. | |
| 5,450,424 A | 9/1995 | Okugaki et al. | |
| 5,469,444 A | 11/1995 | Endoh et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,533,190 A | 7/1996 | Binford et al. | |
| 5,541,886 A | 7/1996 | Hasbun | |
| 5,600,677 A | 2/1997 | Citta et al. | |
| 5,638,320 A | 6/1997 | Wong et al. | |
| 5,657,332 A | 8/1997 | Auclair et al. | |
| 5,675,540 A | 10/1997 | Roohparvar | |
| 5,682,352 A | 10/1997 | Wong et al. | |
| 5,687,114 A | 11/1997 | Khan | |
| 5,696,717 A | 12/1997 | Koh | |
| 5,726,649 A | 3/1998 | Tamaru et al. | |
| 5,726,934 A | 3/1998 | Tran et al. | |
| 5,742,752 A | 4/1998 | DeKoning | |
| 5,748,533 A | 5/1998 | Dunlap et al. | |
| 5,748,534 A | 5/1998 | Dunlap et al. | |
| 5,751,637 A | 5/1998 | Chen et al. | |
| 5,761,402 A | 6/1998 | Kaneda et al. | |
| 5,798,966 A | 8/1998 | Keeney | |
| 5,799,200 A | 8/1998 | Brant et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,428 A | 2/1999 | Ishii et al. | |
| 5,867,429 A | 2/1999 | Chen et al. | |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,946,716 A | 8/1999 | Karp et al. | |
| 5,969,986 A | 10/1999 | Wong et al. | |
| 5,982,668 A | 11/1999 | Ishii et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,009,016 A | 12/1999 | Ishii et al. | |
| 6,023,425 A | 2/2000 | Ishii et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,151,246 A | 11/2000 | So et al. | |
| 6,157,573 A | 12/2000 | Ishii et al. | |
| 6,166,962 A | 12/2000 | Chen et al. | |
| 6,169,691 B1 | 1/2001 | Pasotti et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,259,627 B1 | 7/2001 | Wong | |
| 6,275,419 B1 | 8/2001 | Guterman et al. | |
| 6,278,632 B1 | 8/2001 | Chevallier | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,314,044 B1 * | 11/2001 | Sasaki et al. | 365/230.03 |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,385,092 B1 | 5/2002 | Ishii et al. | |
| 6,392,932 B1 | 5/2002 | Ishii et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,405,342 B1 | 6/2002 | Lee | |
| 6,418,060 B1 | 7/2002 | Yong et al. | |
| 6,442,585 B1 | 8/2002 | Dean et al. | |
| 6,445,602 B1 | 9/2002 | Kokudo et al. | |
| 6,452,838 B1 | 9/2002 | Ishii et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,480,948 B1 | 11/2002 | Virajpet et al. | |
| 6,490,236 B1 | 12/2002 | Fukuda et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,549,464 B2 | 4/2003 | Tanaka et al. | |
| 6,553,510 B1 | 4/2003 | Pekny | |
| 6,558,967 B1 | 5/2003 | Wong | |
| 6,560,152 B1 | 5/2003 | Cernea | |
| 6,567,311 B2 | 5/2003 | Ishii et al. | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzalez et al. | |
| 6,640,326 B1 | 10/2003 | Buckingham et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,683,811 B2 | 1/2004 | Ishii et al. | |
| 6,687,155 B2 | 2/2004 | Nagasue | |
| 6,707,748 B2 | 3/2004 | Lin et al. | |
| 6,708,257 B2 | 3/2004 | Bao | |

| Patent | Kind | Date | Inventor |
|---|---|---|---|
| 6,714,449 | B2 | 3/2004 | Khalid |
| 6,717,847 | B2 | 4/2004 | Chen |
| 6,731,557 | B2 | 5/2004 | Beretta |
| 6,732,250 | B2 | 5/2004 | Durrant |
| 6,738,293 | B1 | 5/2004 | Iwahashi |
| 6,751,766 | B2 | 6/2004 | Guterman et al. |
| 6,757,193 | B2 | 6/2004 | Chen et al. |
| 6,774,808 | B1 | 8/2004 | Hibbs et al. |
| 6,781,877 | B2 | 8/2004 | Cernea et al. |
| 6,804,805 | B2 | 10/2004 | Rub |
| 6,807,095 | B2 | 10/2004 | Chen et al. |
| 6,807,101 | B2 | 10/2004 | Ooishi et al. |
| 6,809,964 | B2 | 10/2004 | Moschopoulos et al. |
| 6,819,592 | B2 | 11/2004 | Noguchi et al. |
| 6,829,167 | B2 | 12/2004 | Tu et al. |
| 6,845,052 | B1 | 1/2005 | Ho et al. |
| 6,851,018 | B2 | 2/2005 | Wyatt et al. |
| 6,851,081 | B2 | 2/2005 | Yamamoto |
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,870,773 | B2 | 3/2005 | Noguchi et al. |
| 6,873,552 | B2 | 3/2005 | Ishii et al. |
| 6,879,520 | B2 | 4/2005 | Hosono et al. |
| 6,882,567 | B1 | 4/2005 | Wong |
| 6,894,926 | B2 | 5/2005 | Guterman et al. |
| 6,907,497 | B2 | 6/2005 | Hosono et al. |
| 6,925,009 | B2 | 8/2005 | Noguchi et al. |
| 6,930,925 | B2 | 8/2005 | Guo et al. |
| 6,934,188 | B2 | 8/2005 | Roohparvar |
| 6,937,511 | B2 | 8/2005 | Hsu et al. |
| 6,958,938 | B2 | 10/2005 | Noguchi et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 6,999,344 | B2 | 2/2006 | Hosono et al. |
| 7,002,843 | B2 | 2/2006 | Guterman et al. |
| 7,006,379 | B2 | 2/2006 | Noguchi et al. |
| 7,012,835 | B2 | 3/2006 | Gonzales et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,039,846 | B2 | 5/2006 | Hewitt et al. |
| 7,042,766 | B1 | 5/2006 | Wang et al. |
| 7,054,193 | B1 | 5/2006 | Wong |
| 7,054,199 | B2 | 5/2006 | Lee et al. |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,071,849 | B2 | 7/2006 | Zhang |
| 7,072,222 | B2 | 7/2006 | Ishii et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,145,805 | B2 | 12/2006 | Ishii et al. |
| 7,151,692 | B2 | 12/2006 | Wu |
| 7,158,058 | B1 | 1/2007 | Yu |
| 7,170,781 | B2 | 1/2007 | So et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzales et al. |
| 7,177,199 | B2 | 2/2007 | Chen et al. |
| 7,177,200 | B2 | 2/2007 | Ronen et al. |
| 7,184,338 | B2 | 2/2007 | Nakagawa et al. |
| 7,187,195 | B2 | 3/2007 | Kim |
| 7,187,592 | B2 | 3/2007 | Guterman et al. |
| 7,190,614 | B2 | 3/2007 | Wu |
| 7,193,898 | B2 | 3/2007 | Cernea |
| 7,193,921 | B2 | 3/2007 | Choi et al. |
| 7,196,644 | B1 | 3/2007 | Anderson et al. |
| 7,196,928 | B2 | 3/2007 | Chen |
| 7,196,933 | B2 | 3/2007 | Shibata |
| 7,197,594 | B2 | 3/2007 | Raz et al. |
| 7,200,062 | B2 | 4/2007 | Kinsely et al. |
| 7,210,077 | B2 | 4/2007 | Brandenberger et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,231,562 | B2 | 6/2007 | Ohlhoff et al. |
| 7,243,275 | B2 | 7/2007 | Gongwer et al. |
| 7,254,690 | B2 | 8/2007 | Rao |
| 7,254,763 | B2 | 8/2007 | Aadsen et al. |
| 7,257,027 | B2 | 8/2007 | Park |
| 7,259,987 | B2 | 8/2007 | Chen et al. |
| 7,266,026 | B2 | 9/2007 | Gongwer et al. |
| 7,266,069 | B2 | 9/2007 | Chu |
| 7,269,066 | B2 | 9/2007 | Nguyen et al. |
| 7,272,757 | B2 | 9/2007 | Stocken |
| 7,274,611 | B2 | 9/2007 | Roohparvar |
| 7,277,355 | B2 | 10/2007 | Tanzana |
| 7,280,398 | B1 | 10/2007 | Lee et al. |
| 7,280,409 | B2 | 10/2007 | Misumi et al. |
| 7,280,415 | B2 | 10/2007 | Hwang et al. |
| 7,283,399 | B2 | 10/2007 | Ishii et al. |
| 7,289,344 | B2 | 10/2007 | Chen |
| 7,301,807 | B2 | 11/2007 | Khalid et al. |
| 7,301,817 | B2 | 11/2007 | Li et al. |
| 7,308,525 | B2 | 12/2007 | Lasser et al. |
| 7,310,255 | B2 | 12/2007 | Chan |
| 7,310,269 | B2 | 12/2007 | Shibata |
| 7,310,271 | B2 | 12/2007 | Lee |
| 7,310,272 | B1 | 12/2007 | Mokhlesi et al. |
| 7,310,347 | B2 | 12/2007 | Lasser |
| 7,312,727 | B1 | 12/2007 | Feng et al. |
| 7,321,509 | B2 | 1/2008 | Chen et al. |
| 7,328,384 | B1 | 2/2008 | Kulkarni et al. |
| 7,342,831 | B2 | 3/2008 | Mokhlesi et al. |
| 7,343,330 | B1 | 3/2008 | Boesjes et al. |
| 7,345,924 | B2 | 3/2008 | Nguyen et al. |
| 7,345,928 | B2 | 3/2008 | Li |
| 7,349,263 | B2 | 3/2008 | Kim et al. |
| 7,356,755 | B2 | 4/2008 | Fackenthal |
| 7,363,420 | B2 | 4/2008 | Lin et al. |
| 7,365,671 | B1 | 4/2008 | Anderson |
| 7,388,781 | B2 | 6/2008 | Litsyn et al. |
| 7,397,697 | B2 | 7/2008 | So et al. |
| 7,405,974 | B2 | 7/2008 | Yaoi et al. |
| 7,405,979 | B2 | 7/2008 | Ishii et al. |
| 7,408,804 | B2 | 8/2008 | Hemink et al. |
| 7,408,810 | B2 | 8/2008 | Aritome et al. |
| 7,409,473 | B2 | 8/2008 | Conley et al. |
| 7,409,623 | B2 | 8/2008 | Baker et al. |
| 7,420,847 | B2 | 9/2008 | Li |
| 7,433,231 | B2 | 10/2008 | Aritome |
| 7,433,697 | B2 | 10/2008 | Karaoguz et al. |
| 7,434,111 | B2 | 10/2008 | Sugiura et al. |
| 7,437,498 | B2 | 10/2008 | Ronen |
| 7,440,324 | B2 | 10/2008 | Mokhlesi |
| 7,440,331 | B2 | 10/2008 | Hemink |
| 7,441,067 | B2 | 10/2008 | Gorobetz et al. |
| 7,447,970 | B2 | 11/2008 | Wu et al. |
| 7,450,421 | B2 | 11/2008 | Mokhlesi et al. |
| 7,453,737 | B2 | 11/2008 | Ha |
| 7,457,163 | B2 | 11/2008 | Hemink |
| 7,457,897 | B1 | 11/2008 | Lee et al. |
| 7,460,410 | B2 | 12/2008 | Nagai et al. |
| 7,460,412 | B2 | 12/2008 | Lee et al. |
| 7,466,592 | B2 | 12/2008 | Mitani et al. |
| 7,468,907 | B2 | 12/2008 | Kang et al. |
| 7,468,911 | B2 | 12/2008 | Lutze et al. |
| 7,469,049 | B1 | 12/2008 | Feng |
| 7,471,581 | B2 | 12/2008 | Tran et al. |
| 7,483,319 | B2 | 1/2009 | Brown |
| 7,487,329 | B2 | 2/2009 | Hepkin et al. |
| 7,487,394 | B2 | 2/2009 | Forhan et al. |
| 7,492,641 | B2 | 2/2009 | Hosono et al. |
| 7,508,710 | B2 | 3/2009 | Mokhlesi |
| 7,526,711 | B2 | 4/2009 | Orio |
| 7,539,061 | B2 | 5/2009 | Lee |

| Patent/Pub No. | Date | Inventor |
|---|---|---|
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim et al. |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzalez et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1* | 5/2006 | Gorobets et al. ............... 711/103 |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1* | 5/2007 | Opsasnick ............... 370/412 |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |

| | | |
|---|---|---|
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0204824 A1 | 8/2009 | Lin et al. |
| 2009/0204872 A1 | 8/2009 | Yu et al. |
| 2009/0225595 A1 | 9/2009 | Kim |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann et al. |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 12/534,898 Official Action dated Mar. 23, 2011.

U.S. Appl. No. 13/047,822 filed Mar. 15, 2011.

U.S. Appl. No. 13/069,406, filed Mar. 23, 2011.

U.S. Appl. No. 13/088,361, filed Apr. 17, 2011.

JEDEC Standard JESD84-C44, "Embedded MultiMediaCard (e•MMC) Mechanical Standard, with Optional Reset Signal", Jedec Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Bez et al., "Introduction to Flash Memory," Proceedings of the IEEE, vol. 91, No. 4, Apr. 2003, pp. 489-502.

Eitan et al., "Multilevel Flash Cells and their Trade-Offs," Proceedings of the 1996 IEEE International Electron Devices Meeting (IEDM)5 New York, New York, pp. 169-172.

Eitan et al., "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pp. 522-524.

Maayan et al., "A 512Mb NROM Flash Data Storage Memory with 8MB/s Data Rate," Proceedings of the 2002 IEEE International Solid-State Circuits Conference (ISSCC 2002), San Francisco, California, Feb. 3-7, 2002, pp. 100-101.

Kim and Koh, "Future Memory Technology including Emerging New Memories," Proceddings of the 24 International Conference on Microelectronics (MIEL 2004), Nis, Serbia, and Montenegro, May 16-19, 2004, vol. 1, pp. 377-384.

Jung et al., "A 117-mm2 3.3-V Only 128-Mb Multilevel NANAD Flash Memory for Mass Storage Applications," IEEE Journal of Solid State Circuits, vol. 31, No. 11, Nov. 1996, pp. 1575-1583.

Takeuchi et al., "A Multipage Cell Architecture for High-Speed Programming Multilevel NAND Flash Memories," IEEE Journal of Solid-State Circuits, vol. 33, No. 8, Aug. 1998, pp. 1228-1238.

Lee et al., "Effects of Floating-Gate Interference on NAND Flash Memory Cell Operation," IEEE Electron Device Letters, vol. 23, No. 5, May 2002, pp. 264-266.

U.S. Appl. No. 60/747,106, filed May 12, 2006.
U.S. Appl. No. 60/868,342, filed Dec. 3, 2006.
U.S. Appl. No. 60/867,399, filed Nov. 28, 2006.

PS8000 NAND Flash Controller device offered by Phison Electronics Corp. (Chutung, Hsinchu, Taiwan), "PS 8000 Controler Specification," revision 1.2, Mar. 28, 2007.

The DatabahnO Flash Memory Controller IP, which is offered by Denali Software, Inc. (Palo Alto, California). Details regarding this product are available at www.denali.com/products/databahn_flash.html.

The Flash FX Proa Flash media manager offered by Datalight, Inc. (Bothell, Washington). This device is described in "FlashFX Pro 3.1 High Performance Flash Manager for Rapid Development of Reliable Products," Nov. 16, 2006.

"Open NAND Flash Interface Specification," revision 1.0, Dec. 28, 2006.

"Bad Block Management in NAND Flash Memories," Application note AN-1819 by STMicroelectronics (Geneva, Switzerland), Nov. 29, 2004.

Suh et al., "A 3.3 V 32 Mb NAND Flash Memory with Incremental Step Pulse Programming Scheme," IEEE Journal of Solid-State Circuits, vol. 30, No. 11, Nov. 1995, pp. 1149-1156.

Mielke et al., "Recovery Effects in the Distributed Cycling of Flash Memories," IEEE Annual International Reliability Physics Symposium, San Jose, California, Mar. 2006, pp. 29-35.

"Wear Leveling in Single Level Cell NAND Flash Memories," Application note AN-1822 by STMicroelectronics (Geneva, Sqitzerland), Feb. 2007.

U.S. Appl. No. 60/822,236, filed Aug. 13, 2006.
U.S. Appl. No. 60/825,913, filed Sep. 17, 2006.
U.S. Appl. No. 60/866,071, filed Nov. 16, 2006.
U.S. Appl. No. 60/866,860, filed Nov. 22, 2006.
U.S. Appl. No. 60/862,612, filed Oct. 24, 2006.
U.S. Appl. No. 60/871,838, filed Dec. 26, 2006.
U.S. Appl. No. 60/882,240, filed Dec. 28, 2006.
U.S. Appl. No. 60/883,071, filed Jan. 2, 2007.
U.S. Appl. No. 60/885,987, filed Jan. 22, 2007.

Wei, L., "Trellis-Coded Modulation With Multidimensional Constellations", IEEE Transactions on Information Theory, vol. IT-33, No. 4, pp. 483-501, Jul. 1987.

U.S. Appl. No. 13/114,049 Official Action dated Sep 12, 2011.
U.S. Appl. No. 12/405,275 Official Action dated Jul. 29, 2011.

Conway et al., "Sphere Packings, Lattices and Groups", 3rd edition, chapter 4, pp. 94-135, Springer, New York, USA 1998.

Chinese Patent Application # 200780040493.X Official Action dated Jun. 15, 2011.

U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/019,011 Official Action dated Nov. 20, 2009.

Takeuchi et al., "A Multipage Cell Architecture for High-Speed Programming Multilevel NAND Flash Memories", IEEE Journal of Solid State Circuits, vol. 33, No. 8, Aug. 1998.

Agrell et al., "Closest Point Search in Lattices", IEEE Transactions on Information Theory, vol. 48, No. 8, pp. 2201-2214, Aug. 2002.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Kawaguchi et al. 1995. A flash-memory based file system. In Proceedings of the USENIX 1995 Technical Conference , New Orleans, Louisiana. 155-164.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
International Application PCT/IL2008/001446 "Optimized selection of memory chips in multi-chip memory devices" filed on Nov. 4, 2008.
Perlmutter et al, U.S. Appl. No. 12/332,368 "Efficient Interference Cancellation in Analog Memory Cell Arrays" filed on Dec. 11, 2008.
Kasorla et al, U.S. Appl. No. 12/332,370 "Efficient Data Storage in Multi-Plane Memory Devices" filed on Dec. 11, 2008.
Sommer, N., U.S. Appl. No. 12/364,531 "Parameter Estimation Based on Error Correction Code Parity Check Equations" filed on Feb. 3, 2009.
Golov et al., U.S. Appl. No. 12/344,233 "Wear Level Estimation in Analog Memory Cells" filed on Dec. 25, 2008.
Perlmutter et al., U.S. Appl. No. 12/388,528 "Programming of Analog Memory Cells Using a Single Programming Pulse per State Transition" filed on Feb. 19, 2009.
Perlmutter et al., U.S. Appl. No. 12/390,522 "Programming Analog Memory Cells for Reduced Variance After Retention" filed on Feb. 23, 2009.
Perlmutter et al., U.S. Appl. No. 12/405,275 "Memory Device with Multiple-Accuracy Read Commands" filed on Mar. 17, 2009.
Perlmutter et al., U.S. Appl. No. 12/397,368 "Efficient Readout from Analog Memory Cells Using Data Compression" filed on Mar. 4, 2009.
Sommer, N., U.S. Appl. No. 12/171,797 "Memory Device with Non-Uniform Programming Levels" filed on Jul. 11, 2008.
Shalvi et al., U.S. Appl. No. 12/251,471 "Compensation for Voltage Drifts in Analog Memory Cells" filed on Oct. 15, 2008.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed on Jun. 24, 2010.
U.S. Appl. No. 11/949,135 Official Action dated Oct. 2, 2009.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
Ubuntu Forums, "Memory Stick Failed IO Superblock", posted Nov. 11, 2009.
Super User Forums, "SD Card Failure, can't read superblock", posted Aug. 8, 2010.
U.S. Appl. No. 12/987,174 "Redundant Data Storage in Multi-Die Memory Systems", filed Jan. 10, 2011.
U.S. Appl. No. 12/987,175 "Redundant Data Storage Schemes for Multi-Die Memory Systems" filed Jan. 10, 2011.
U.S. Appl. No. 12/963,649 "Memory Management Schemes for Non-Volatile Memory Devices" filed Dec. 9, 2010.
U.S. Appl. No. 13/021,754 "Reducing Peak Current in Memory Systems" filed Feb. 6, 2011.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
U.S. Appl. No. 12/323,544 Office Action dated Dec. 13, 2011.
U.S. Appl. No. 12/332,368 Office Action dated Nov. 10, 2011.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.

Budilovsky et al., "Prototyping a High-Performance Low-Cost Solid-State Disk", SYSTOR—The 4th Annual International Systems and Storage Conference, Haifa, Israel, May 30-Jun. 1, 2011.

NVM Express Protocol, "NVM Express", Revision 1.0b, Jul. 12, 2011.

SCSI Protocol, "Information Technology—SCSI Architecture Model—5 (SAM-5)", INCITS document T10/2104-D, revision 01, Jan. 28, 2009.

SAS Protocol, "Information Technology—Serial Attached SCSI—2 (SAS-2)", INCITS document T10/1760-D, revision 15a, Feb. 22, 2009.

US 7,161,836, 01/2007, Wan et al. (withdrawn)

* cited by examiner

MEMORY DEVICE WITH ADAPTIVE CAPACITY

CROSS-REFERENCE TO RELATED APPLICATIONS

This application is the U.S. national phase of PCT Application No. PCT/IL2007/000579, filed May 10, 2007, which claims the benefit of U.S. Provisional Patent Application 60/747,106, filed May 12, 2006, U.S. Provisional Patent Application 60/822,236, filed Aug. 13, 2006, U.S. Provisional Patent Application 60/825,913, filed Sep. 17, 2006, U.S. Provisional Patent Application 60/866,071, filed Nov. 16, 2006, U.S. Provisional Patent Application 60/866,860, filed Nov. 22, 2006, U.S. Provisional Patent Application 60/867,399, filed Nov. 28, 2006, U.S. Provisional Patent Application 60/871,838, filed Dec. 26, 2006, U.S. Provisional Patent Application 60/882,240, filed Dec. 28, 2006, U.S. Provisional Patent Application 60/883,071, and filed Jan. 2, 2007, U.S. Provisional Patent Application 60/885,987, filed Jan. 22, 2007, whose disclosures are incorporated herein by reference.

FIELD OF THE INVENTION

The present invention relates generally to memory devices, and particularly to memory devices having adaptive storage capacity.

BACKGROUND OF THE INVENTION

Several types of memory devices, such as Flash memories and Dynamic Random Access Memory (DRAM), use arrays of analog memory cells for storing data. Flash memory devices are described, for example, by Bez et al., in "Introduction to Flash Memory," Proceedings of the IEEE, volume 91, number 4, April, 2003, pages 489-502, which is incorporated herein by reference.

In such memory devices, each analog memory cell typically comprises a transistor, which holds a certain amount of electric charge that represents the information stored in the cell. The electric charge written into a particular cell influences the "threshold voltage" of the cell, i.e., the voltage that needs to be applied to the cell so that the cell will conduct current.

Some memory devices, commonly referred to as Single-Level Cell (SLC) devices, store a single bit of information in each memory cell. Typically, the range of possible threshold voltages of the cell is divided into two regions. A voltage value falling in one of the regions represents a "0" bit value, and a voltage belonging to the second region represents "1". Higher-density devices, often referred to as Multi-Level Cell (MLC) devices, store two or more bits per memory cell. In multi-level cells, the range of threshold voltages is divided into more than two regions, with each region representing more than one bit.

Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, Which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference.

Other exemplary types of analog memory cells are Ferroelectric RAM (FRAM) cells, magnetic RAM (MRAM) cells and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MML), Nis, Serbia and Montenegro, May 16-19, 2004, volume 1, pages 377-384, which is incorporated herein by reference.

In some applications, data is stored in memory cells at varying densities. For example, U.S. Pat. No. 6,363,008, whose disclosure is incorporated herein by reference, describes a multiple-bit-per-cell memory that includes multiple memory arrays, wherein the number of bits stored per cell is separately set for each of the memory arrays. Memory arrays that testing proves are accurate when writing, storing, and reading a larger number of bits per cell are set to store more bits per cell, and memory arrays that cannot accurately write, store, or read as many bits per cell are set to store fewer bits per cell.

In U.S. Pat. No. 6,456,528, whose disclosure is incorporated herein by reference, a flash non-volatile memory system that normally operates its memory cells in multiple storage states is provided with the ability to operate some selected or all of its memory cell blocks in two states instead. The two states are selected to be the furthest separated of the multiple states, thereby providing an increased margin during two-state operation.

U.S. Pat. No. 5,930,167, whose disclosure is incorporated herein by reference, describes a memory system including an array of flash Electrically Erasable and Programmable Read Only Memory (EEPROM) cells arranged in blocks of cells that are erasable together. The individual cells store more than one bit of data as a result of operating the individual cells with more than two detectable threshold ranges or states. Any portion of the array in which data is not stored can be used as a write cache, where individual ones of the cells store a single bit of data by operating with only two detectable threshold ranges. Data coming into the memory is initially written in available blocks in two states. At a later time, in the background, the cached data is read, compressed and written back into fewer blocks of the memory in multi-state.

U.S. Pat. No. 6,466,476, whose disclosure is incorporated herein by reference, describes multi-bit-per-cell non-volatile memory, which stores different portions of a data stream using different numbers of bits per cell. In particular, data that requires a high degree of data integrity (e.g., the header of a data frame) is stored using a relatively small number of bits per memory cell. Data that is more error-tolerant (e.g., the main data representing music, images, or video) is stored using a relatively large number of bits per memory cell.

U.S. Pat. No. 6,643,169, whose disclosure is incorporated herein by reference, describes a method for storing data in varying numbers of bits per cell depending on the type of data involved. The number of bits may be increased per cell when fidelity is less important. The number of bits per cell may be decreased when fidelity is more important. A memory, in some embodiments, may change between storage modes on a cell by cell basis.

SUMMARY OF THE INVENTION

Embodiments of the present invention provide a method for data storage in a memory that includes a plurality of analog memory cells, the method including:

estimating respective achievable storage capacities of the analog memory cells;

assigning the memory cells respective storage configurations defining quantities of data to be stored in the memory cells based on the estimated achievable capacities;

storing the data in the memory cells in accordance with the respective assigned storage configurations; and re-estimating the respective achievable storage capacities of the analog memory cells after the memory has been installed in a host system and used for storing the data in the host system, and modifying the storage configurations responsively to the re-estimated achievable capacities.

In some embodiments, storing the data includes encoding the data using an Error Correcting Code (ECC), converting the encoded data to analog values selected from a set of nominal analog values and writing the analog values into the respective memory cells, and each storage configuration specifies a respective ECC code rate and a size of a set of nominal analog values used for storing the data.

In an embodiment, for each analog memory cell, storing the data includes converting the data to analog values selected from a set of nominal analog values and writing the analog values into the memory cell, and each storage configuration specifies the nominal analog values used for storing the data in the analog memory cell.

In another embodiment, storing the data includes converting the data to analog values and writing the analog values into the respective memory cells, and estimating the achievable storage capacities includes estimating respective distortion levels affecting the analog values written into the memory cells and determining the achievable storage capacities responsively to the distortion levels.

Estimating the distortion levels may include reading the analog values from the memory cells and estimating the distortion levels based on the analog values read from the memory cells. Estimating the distortion levels may include reconstructing the data from the analog values read from the memory cells and calculating the distortion levels based on the reconstructed data. In some embodiments, calculating the distortion levels includes summing scalar functions of the analog values read from the memory cells. Summing the scalar functions may include summing squares of differences between the analog values read from the memory cells and respective expected values of the data stored in the memory cells responsively to the data. In another embodiment, calculating the distortion levels includes counting a number of memory cells in which a difference between the analog values read from the memory cells and respective expected values of the data stored in the memory cells responsively to the data exceeds a predetermined value.

In a disclosed embodiment, storing the data includes writing the analog values into the memory cells and verifying the written analog values using an iterative Program and Verify (P&V) process, and estimating the distortion levels includes calculating the distortion levels based on the analog values verified by the P&V process.

In another embodiment, storing the data includes writing the analog values into the memory cells and verifying the written analog values using an iterative Program and Verify (P&V) process, which iteratively increments the analog values by a programming step, and the storage configurations define a size of the programming step used by the iterative P&V process.

In yet another embodiment, storing the data includes encoding the data to be stored in a group of the memory cells using an Error Correcting Code (ECC) and converting the encoded data to analog values for storage in the respective analog memory cells of the group, estimating the achievable storage capacities includes reading the analog values from the memory cells in the group and evaluating a distance metric between the read analog values and a valid codeword of the ECC that is nearest to the analog values, and modifying the storage configurations includes adapting the storage configuration of the group of the memory cells responsively to the evaluated distance metric.

In still another embodiment, re-estimating the achievable storage capacities includes reading the data stored in the memory cells, and modifying the storage configurations includes adapting the storage configurations responsively to detecting errors in the read data. Storing the data may include encoding the data using an Error Correcting Code (ECC), and adapting the storage configurations may include modifying a code rate of the ECC.

In some embodiments, estimating the achievable capacities of the memory cells includes tracking previous programming and erasure operations applied to the respective memory cells and estimating the achievable capacities responsively to the tracked previous programming and erasure operations. Estimating the achievable capacities may include calculating the achievable capacities responsively to lengths of time periods that elapsed since the previous programming and erasure operations.

In an embodiment, storing the data includes converting an initial portion of the data to analog values and writing the analog values into the respective memory cells, and subsequently storing an additional portion of the data in at least some of the memory cells by increasing the analog values written to the memory cells without erasing the cells.

In another embodiment, storing the data includes encoding the data using an Error Correcting Code (ECC) that adds redundancy bits to the data and storing the redundancy bits in some of the analog memory cells, and modifying the storage configurations includes modifying a number of the redundancy bits added by the ECC without erasing the cells. Storing the redundancy bits may include storing the redundancy bits separately from the data.

In yet another embodiment, assigning the storage configurations includes predefining a set of possible storage configurations, and modifying the storage configurations includes selecting updated storage configurations from the predefined set. The quantity of the data defined by at least one of the storage configurations may specify a non-integer number of bits per cell.

In still another embodiment, storing the data includes compressing the data before writing the data to the memory cells, and the storage configurations define respective compression ratios by which the data is to be compressed. In a disclosed embodiment, assigning the storage configurations includes defining the storage configurations for respective groups of the memory cells.

In an embodiment, storing the data in the memory cells includes accepting a data item for storage in the memory, selecting a subset of the memory cells in which to store the data item responsively to the assigned storage configurations, and storing the data item in the selected subset of the memory cells. In some embodiments, re-estimating the achievable storage capacities is performed during idle time periods in which the data is not stored and read.

In another embodiment, assigning and modifying the storage configurations include storing the storage configurations in a configuration table. In some embodiments, initial values of the storage configurations may be stored in the configuration table before the memory has been installed in the host system. In yet another embodiment, assigning and modifying the storage configurations include maintaining a predetermined margin between the quantities of the data stored in the memory cells and the respective estimated achievable capacities. In still another embodiment, at least some of the distortion is caused by leakage current in the analog memory cells, and estimating the distortion includes estimating the leakage current.

There is additionally provided, in accordance with an embodiment of the present invention, a method for data storage in a memory that includes a plurality of analog memory cells, the method including:

estimating distortion levels in the respective analog memory cells;

estimating respective achievable storage capacities of the analog memory cells based on the estimated distortion levels;

assigning the memory cells respective storage configurations defining quantities of data to be stored in the memory cells based on the estimated achievable capacities; and storing the data in the memory cells in accordance with the respective assigned storage configurations.

There is also provided, in accordance with an embodiment of the present invention, a method for data storage in a memory that includes a plurality of analog memory cells, the method including:

tracking respective achievable storage capacities of the analog memory cells while the memory is in use in a host system;

accepting data for storage in the memory;

selecting a subset of the memory cells for storing the data based on the tracked achievable capacities; and storing the data in the memory cells of the subset.

In some embodiments, selecting the subset includes selecting the memory cells whose aggregate achievable capacity best matches a size of the accepted data. In another embodiment, accepting the data includes accepting a requested reliability level for storing the data, and selecting the subset includes selecting the memory cells responsively to the requested reliability level. Additionally or alternatively, accepting the data includes accepting a requested retention period for storing the data, and selecting the subset includes selecting the memory cells responsively to the requested retention period. Selecting the subset may include selecting the memory cells having low distortion levels with respect to other memory cells.

In another embodiment, tracking the achievable storage capacities includes tracking previous programming and erasure operations applied to the memory cells, and selecting the subset includes selecting the memory cells responsively to the previous programming and erasure operations. Selecting the subset may include distributing a number of programming and erasure operations evenly over the memory cells in the memory by selecting the memory cells having a smaller number of the previous programming and erasure operations with respect to other memory cells. Distributing the number of programming and erasure operations may include selecting the memory cells having the smaller number of the previous programming and erasure operations performed during a predetermined recent time period with respect to the other memory cells.

In a disclosed embodiment, tracking the achievable storage capacities includes calculating and reporting to the host system a size of an available memory space by summing the achievable capacities of the memory cells that are available for storing the data.

In another embodiment, the memory is divided into multiple erasure blocks, each erasure block including a group of the memory cells that are erased in a single erasure operation, and the method includes erasing a data item from the memory by:

identifying one or more of the erasure blocks in which the data item is stored;

when the erasure blocks in which the data item is stored contain stored data of another data item, identifying alternative memory cells outside the erasure blocks in which the data item is stored based on the tracked achievable capacities of the memory cells and on a size of the other data item, and copying the data of the other data item to the alternative memory cells; and erasing the erasure blocks in which the data item is stored.

In an embodiment, accepting the data for storage includes accepting the data in fixed-capacity blocks from the host system and storing the data in variable-capacity groups of the memory cells based on the tracked achievable capacities of the variable-size groups. In another embodiment, storing the data in the variable-capacity groups includes identifying two or more variable-capacity groups having capacities that are smaller than a capacity of the fixed-capacity block, and storing the data accepted in one or more of the fixed-capacity blocks in the identified two or more variable-capacity groups.

In yet another embodiment, storing the data in the variable-capacity groups includes allocating one or more of the variable-capacity groups to serve as an excess memory storage area, storing the data accepted in the flied-capacity blocks in respective variable-capacity groups, and, when the achievable capacity of a variable-capacity group is smaller than a capacity of the fixed-capacity blocks, storing some of the data accepted in the respective fixed-capacity block in the allocated excess memory storage area. In still another embodiment, storing the data in the variable-capacity groups includes storing the data accepted in the fixed-capacity blocks sequentially in the memory cells irrespective of boundaries between the variable-capacity groups. Storing the data may include initially storing the data accepted in each fixed-capacity block in a respective variable-capacity group, and subsequently re-programming the initially-stored data sequentially, irrespective of the boundaries between the variable-capacity groups.

In some embodiments, the method includes retrieving the data from the variable-size groups, reconstructing the fixed-size blocks and outputting the data using the fixed-size blocks to the host system. The method may include reducing a number of memory access operations applied to the memory by caching at least some of the data. Caching the at least some of the data may include transferring the cached data to the memory upon detecting an immediate storage event. The immediate storage event may include at least one event selected from a group of events consisting of an approaching power failure, a time out and an End Of File (EOF) command accepted from the host system.

There is also provided, in accordance with an embodiment of the present invention, data storage apparatus, including:

an interface, which is arranged to communicate with a memory that includes a plurality of analog memory cells; and a memory signal processor (MSP), which is arranged to estimate respective achievable storage capacities of the memory cells, to assign the memory cells respective storage configurations defining quantities of data to be stored in the memory cells based on the estimated achievable capacities, to store the data in the memory cells in accordance with the respective assigned storage configurations, to re-estimate the respective achievable storage capacities of the analog memory cells after the memory has been installed in a host system and used for storing the data in the host system, and to modify the storage configurations responsively to the re-estimated achievable capacities.

There is further provided, in accordance with an embodiment of the present invention, data storage apparatus, including:

an interface, which is arranged to communicate with a memory that includes a plurality of analog memory cells; and a memory signal processor (MSP), which is arranged to estimate distortion levels in the respective analog memory cells, to estimate respective achievable storage capacities of the analog memory cells based on the estimated distortion levels, to assign the memory cells respective storage configurations defining quantities of data to be stored in the memory cells based on the estimated achievable capacities, and to store the data in the memory cells in accordance with the respective assigned storage configurations.

There is also provided, in accordance with an embodiment of the present invention, data storage apparatus, including:

an interface, which is arranged to communicate with a memory that includes a plurality of analog memory cells; and a memory signal processor (MSP), which is arranged to track respective achievable storage capacities of the memory cells while the memory is in use in a host system, to accept data for storage in the memory, to select a subset of the memory cells for storing the data based on the tracked achievable capacities, and to store the data in the memory cells of the subset.

There is additionally provided, in accordance with an embodiment of the present invention, data storage apparatus, including:

a memory, which includes a plurality of analog memory cells; and a memory signal processor (MSP), which is coupled to the memory and is arranged to estimate respective achievable storage capacities of the memory cells, to assign the memory cells respective storage configurations defining quantities of data to be stored in the memory cells based on the estimated achievable capacities, to store the data in the memory cells in accordance with the respective assigned storage configurations, to re-estimate the respective achievable storage capacities of the analog memory cells after the memory has been installed in a host system and used for storing the data in the host system, and to modify the storage configurations responsively to the re-estimated achievable capacities.

In some embodiments, the memory resides in a first Integrated Circuit (IC) and the MSP resides in a second IC different from the first IC. In an alternative embodiment, the memory and the MSP are integrated in a single device. Further alternatively, the MSP may be embodied in a processor of the host system. In some embodiments, the memory cells may include Flash memory cells, Dynamic Random Access Memory (DRAM) cells, Phase Change Memory (PCM) cells, Nitride Read-Only Memory (NROM) cells, Magnetic Random Access Memory (MRAM) cells or Ferroelectric Random Access Memory (FRAM) cells.

There is additionally provided, in accordance with an embodiment of the present invention, data storage apparatus, including:

a memory, which includes a plurality of analog memory cells; and a memory signal processor (MSP), which is coupled to the memory and is arranged to track respective achievable storage capacities of the memory cells while the memory is in use in a host system, to accept data for storage in the memory, to select a subset of the memory cells for storing the data based on the tracked achievable capacities, and to store the data in the memory cells of the subset.

The present invention will be more fully understood from the following detailed description of the embodiments thereof, taken together with the drawings in which:

DETAILED DESCRIPTION OF EMBODIMENTS

Overview

Figure 1:
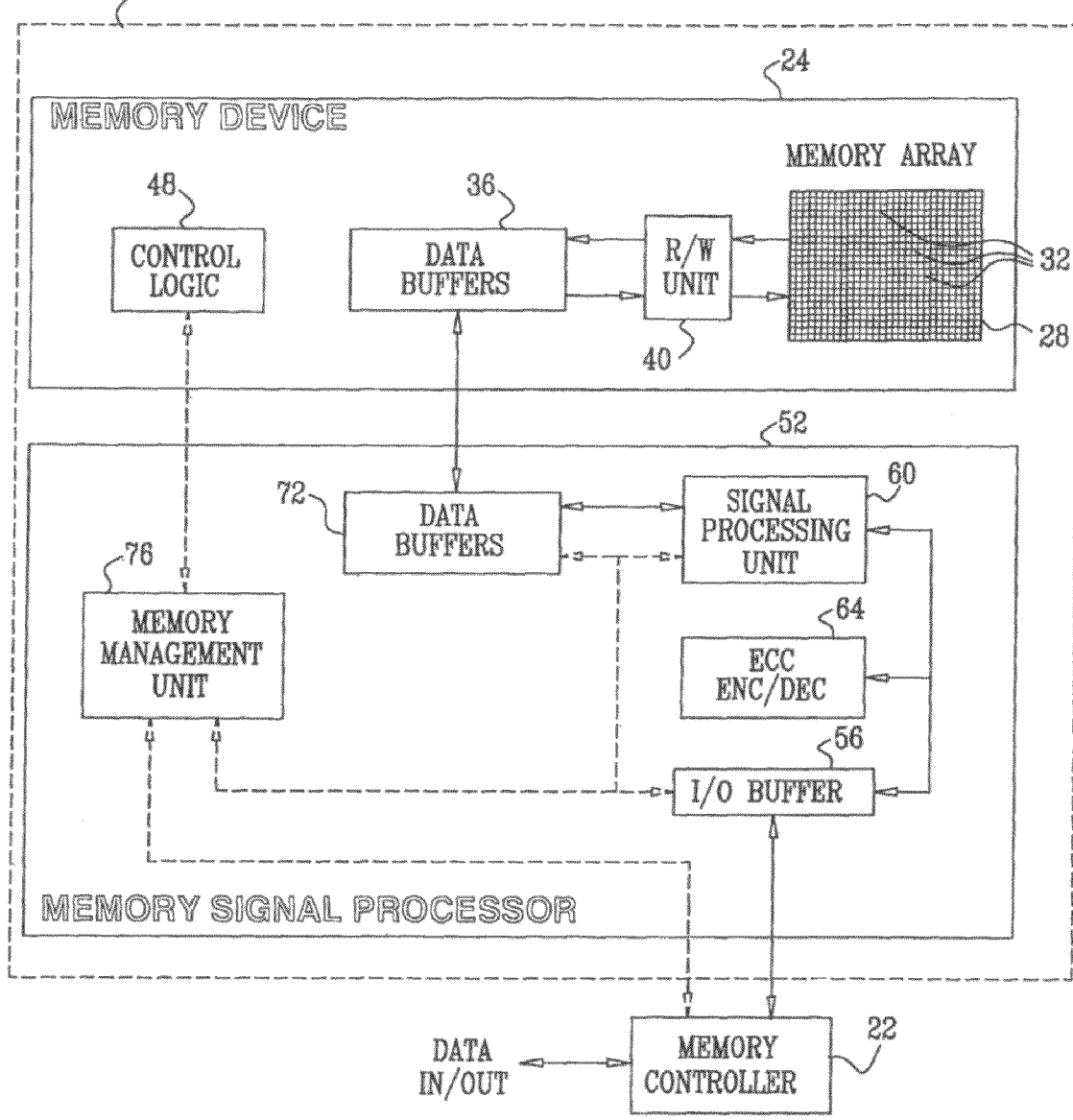
FIG. 1 is a block diagram that schematically illustrates a memory system, in accordance with an embodiment of the present invention.

The achievable storage capacity of analog memory cell arrays, such as Flash memories, varies over time. In many cases, the achievable capacity of a memory cell array decreases over time because of repeated programming and erasure operations, aging and other effects. The capacity variations often differ from cell to cell in the array. On the other hand, memory devices are usually specified to provide a certain capacity at a certain reliability level, and to meet these specifications for a certain data retention period.

Some known memory devices and associated storage methods handle varying cell capacity by over-designing or over-specifying the size and performance of the memory cell array. In such devices, the number of memory cells and their performance are specified with margins that are sufficiently large to keep the device within specification, given the anticipated degradation over the desired retention period. Such design methods are often inefficient, increase cost and complexity and reduce the usable capacity of the memory device.

Embodiments of the present invention provide improved methods and systems for storing data in memory devices, by adaptively modifying the density in which data is stored.

In some embodiments, a Memory Signal Processor (MSP) stores data in a memory device that includes a plurality of analog memory cells, such as a Flash or DRAM device. The MSP continually estimates the achievable storage capacities of the memory cells. The MSP may estimate the achievable capacity based on factors such as the distortion levels in the memory cells, reliability and/or retention requirements specified for the data, errors detected in the data that is programmed in the cells and/or the history of previous programming and erasure operations the cells have gone through.

Based on the estimated achievable capacities, the MSP assigns the memory cells respective storage configurations. Each storage configuration defines the amount of data that can be stored in the respective memory cells. For example, the storage configuration may define a number of nominal voltage levels and an Error Correction Coding (ECC) scheme used for storing data in the memory cells. In some embodiments, the MSP selects the appropriate storage configuration from a limited set of predefined configurations.

The MSP stores the data in the memory cells in accordance with the storage configurations assigned to the cells. The MSP adaptively modifies the storage configurations over time, throughout the lifetime of the memory device, so that the density in which data is stored in the memory cells matches the achievable capacities of the cells.

Unlike some known memory devices and data storage methods in which the storage density is specified a-priori, the methods and systems described herein track the achievable capacity of the different memory cells throughout the life cycle of the memory array and continually adapt the density in which data is stored accordingly. As a result, the achievable capacity of the memory device can be exploited optimally as it changes over time, thus reducing size and cost.

The MSP interacts with a memory controller or other host, i.e., accepts data for storage from the memory controller and retrieves data that is stored in memory when requested by the memory controller. In some embodiments, the MSP emulates fixed-capacity operation towards the memory controller, even though it stores the data in cell groups having variable capacity. Such methods are used, for example, when the MSP interacts with legacy memory controllers, which are designed to control memory devices having fixed capacity and fixed page size. Thus, by mediating between the fixed-capacity operation of the memory controller and the adaptive-capacity characteristics of the storage methods described herein, legacy memory controllers can be used without modification.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (e.g. "disk-on-key" devices), digital cameras, music and other media players and/or any other system or device in which data is stored and retrieved. In a typical application, memory system 20 interacts with a memory controller 22, i.e., accepts data for storage from the memory controller and outputs data that is stored in memory to the memory controller when requested.

System 20 comprises a memory device 24, which stores data in a memory cell array 28. The memory array comprises multiple analog memory cells 32. In the context of the present patent application and in the claims, the term "analog memory cell" is used to describe any memory element that holds a continuous, analog value of a physical parameter, such as an electrical voltage or charge. Array 28 may comprise analog memory cells of any kind, such as, for example, NAND and NOR Flash cells, PCM, NROM, FRAM, MRAM and DRAM cells. The charge levels stored in the cells and/or the analog voltages written into and read out of the cells are referred to herein collectively as analog values.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, unit 40 converts the electric charge, and thus the analog voltages of memory cells 32, into digital samples, each having a resolution of one or more bits. The samples produced by unit 40 are cached in buffers 36. The operation and timing of memory device 24 is managed by control logic 48.

The storage and retrieval of data in and out of memory device 24 is performed by a Memory Signal Processor (MSP) 52. MSP 52 intermediates between memory device 24 and memory controller 22 or other host. As will be shown in detail hereinbelow, MSP 52 uses novel methods for adaptively estimating the achievable capacity of memory cells 32, and for managing the storage and retrieval of data in memory array 28 based on the estimated cell capacities. MSP 52 adaptively modifies the density in which data is stored in array 28, so as to provide optimal capacity throughout the lifetime of the system.

MSP 52 can write data into memory cells 32 at different densities, depending on the achievable capacity of the cells. In the context of the present patent application and in the claims, the term "capacity" is used to describe the amount of information (usually expressed in bits-per-cell units) that a given cell or group of cells is capable of holding reliably. The term "density" is used to describe the amount of information, usually in bit-per-cell units, which is actually stored in a cell or group of cells. Thus, information can be stored reliably in a group of cells at different densities, as long as the capacity is not exceeded. Thus, the storage density of a cell or group of cells is by definition no greater than its capacity, assuming the data is stored reliably.

MSP 52 can vary the density in which data is stored in cells 32, for example by changing the number of voltage levels used for writing the data into cells 32. Using a higher number of voltage levels enables higher information density. In some embodiments, MSP 52 encodes the data stored in device 24 using an Error Correcting Code (ECC). MSP 52 comprises an encoder/decoder 64, which encodes the data to be written to device 24 and decodes the data read out of device 24. In some implementations, MSP 52 varies the information density by selecting different codes or varying the code rate of the ECC.

A signal processing unit 60 processes the data that is written into and retrieved from device 24. In particular, unit 60 estimates the distortion that is present in the voltages read out of cells 32. The estimated distortion is used to estimate the achievable capacity of cells 32, and to determine the desired storage density to be used. MSP 52 comprises a data buffer 72, which is used by unit 60 fpr storing data and serves as an interface for communicating with memory device 24. MSP 52 also comprises an Input/Output (I/O) buffer 56, which forms an interface between the MSP and the memory controller.

A memory management unit 76 manages the operation and timing of MSP 52. In particular, unit 76 tracks the estimated capacity and status of each memory cell or group of cells, so that MSP 52 stores data in each cell or group at a density that matches its estimated capacity. Signal processing unit 60 and management unit 76 may be implemented in hardware. Alternatively, unit 60 and/or unit 76 may comprise microprocessors that run suitable software, or a combination of hardware and software elements. In some embodiments, encoder/decoder 64, or parts thereof, can also be implemented in software. In some embodiments, the functionality of MSP 52 can sometimes be implemented in software and carried out by a suitable processor or other element of the host system.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits, data scrambling circuits and debugging circuits, have been omitted from the figure for clarity.

In some embodiments, memory device 24 and MSP 52 are implemented in two separate Integrated Circuits (ICs). In alternative embodiments, however, the memory device and MSP may be integrated in a single IC or System on Chip (SoC). In some implementations, a single MSP 52 may be connected to multiple memory devices 24. Additional architectural aspects of certain embodiments of system 20 are described in greater detail in U.S. Provisional Patent Application 60/867,399, cited above. Alternatively, some or all of the functionality of memory controller may be embodied in MSP 52, as will be explained in detail further below.

In a typical writing operation, data to be written into memory device 24 is accepted from memory controller 22 and cached in I/O buffer 56. Memory management unit 76 determines the cells into which the data is to be written. Unit 76 also determines a storage configuration (e.g., a number of voltage levels and a code rate) to be used, based on the estimated capacity of the designated cells. Encoder/decoder 64 encodes the data, and the encoded data is transferred, via data buffers 72, to memory device 24. In device 24 the data is temporarily stored in buffers 36. R/W unit 40 converts the data to analog voltage values and writes the data into the appropriate cells 32 of array 28.

In a typical reading operation, R/W unit 40 reads analog voltage values out of the appropriate memory cells 32 and converts the voltages to digital samples. The samples are cached in buffers 36 and transferred to buffers 72 of MSP 52. Blocks of data are transferred from buffers 72 to unit 60, and encoder/decoder 64 decodes the ECC of these blocks. The decoded data is transferred via I/O buffer 56 to memory controller 22.

Memory controller 22 may sometimes comprise a known device such as the PS8000 NAND Flash controller device offered by Phison Electronics Corp. (Chutung, Hsinchu, Taiwan). This device is specified in "PS8000 Controller Specification," revision 1.2, Mar. 28, 2007, which is incorporated herein by reference. Another known memory controller is the Databahn™ Flash memory controller IP, which is offered by Denali Software, Inc. (Palo Alto, Calif.). Details regarding this product are available at www.denali.com/products/databahn_flash.html. Yet another example is the FlashF'X Pro® Flash media manager offered by Datalight, Inc. (Bothell, Wash.). This device is described in "FlashFX Pro 3.1 High Performance Flash Manager for Rapid Development of Reliable Products," Nov. 16, 2006, which is incorporated herein by reference.

When memory controller 22 comprises a conventional memory controller device, it often has predefined interfaces and protocols for communicating with memory devices. These interfaces and protocols are usually designed for communicating with memory devices having fixed storage capacities. In some embodiments, MSP 52 emulates the data structures, interfaces and protocols used by memory controller 22, thus intermediating between the adaptive capacity characteristics of system 20 and the fixed capacity characteristics of memory controller 22. Several exemplary methods are described in FIGS. 14-17 below.

In alternative embodiments, some of the memory management functions are implemented in MSP 52. In these embodiments, the MSP accepts data items for storage and may partition and store them in variable capacity pages, without having to emulate fixed capacity operation.

The interface between MSP 52 and memory device 24, and/or the interface between

MSP 52 and memory controller 22, may conform to a known standard or protocol. For example, one or both of these interfaces may conform to the Open NAND Flash Interface (ONFI) Specification. The ONFI specification is defined in "Open NAND Flash Interface Specification," revision 1.0, Dec. 28, 2006, which is incorporated herein by reference.

Memory Array Structure and Distortion Mechanisms

Figure 2:
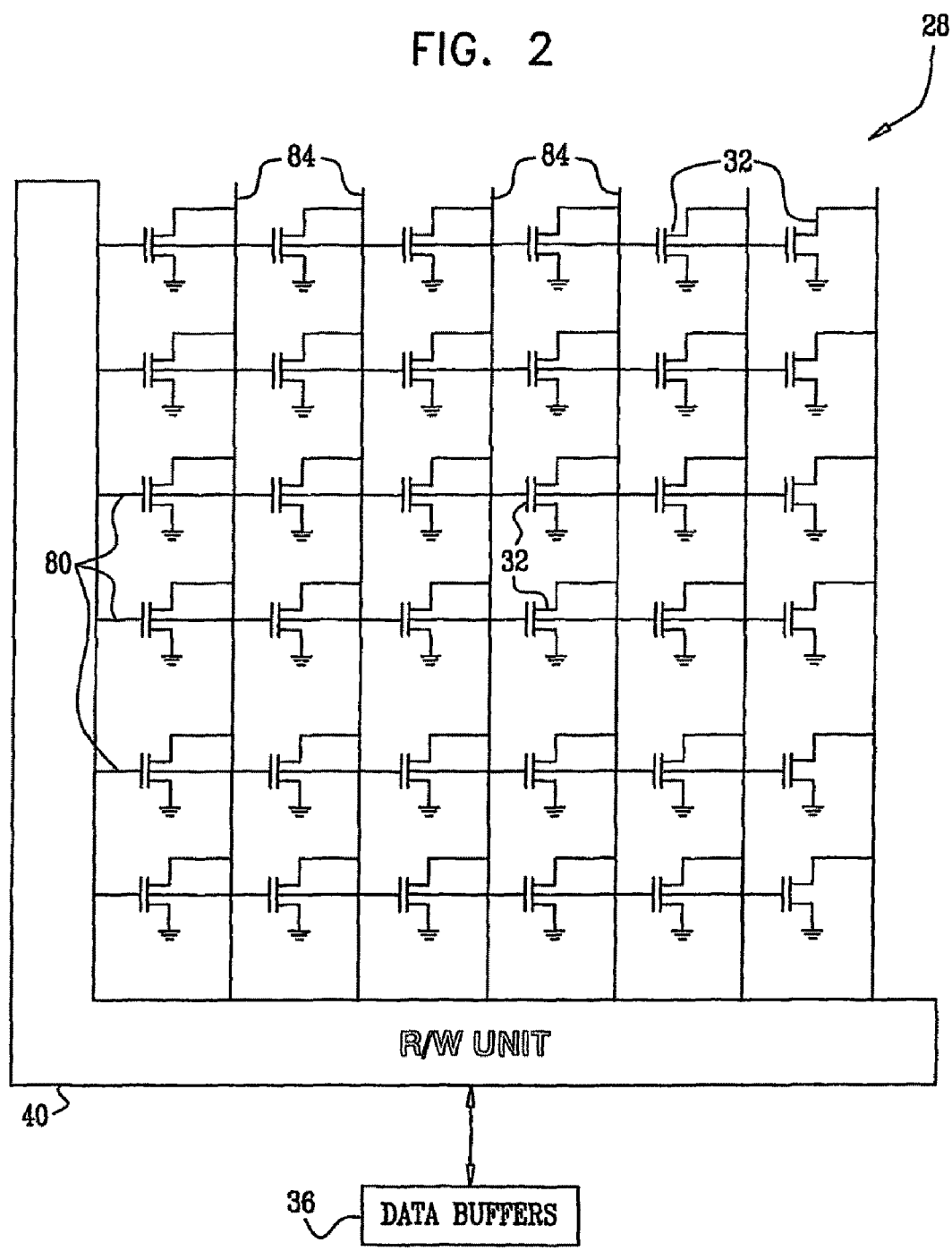
FIG. 2 is a diagram that schematically illustrates a memory cell array, in accordance with an embodiment of the present invention.

FIG. 2 is a diagram that schematically illustrates memory cell array 28, in accordance with an embodiment of the present invention. Although FIG. 2 refers to Flash memory cells that are connected in a particular array configuration, the principles of the present invention are applicable to other types of memory cells and other array configurations, as well. Some exemplary cell types and array configurations are described in the references cited in the Background section above.

Memory cells 32 of array 28 are arranged in a grid having multiple rows and columns. Each cell 32 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is proportional to the charge stored in the cell.

In the exemplary configuration of FIG. 2, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

Typically, R/W unit 40 reads the threshold voltage of a particular cell 32 by applying varying voltage levels to its gate (i.e., to the word line to which the cell is connected) and checking whether the drain current of the cell exceeds a certain threshold (i.e., whether the transistor conducts). Unit 40 usually applies a sequence of different voltage values to the word line to which the cell is connected, and determines the lowest gate voltage value for which the drain current exceeds the threshold. Typically, unit 40 reads a group of cells from a certain row simultaneously.

In some embodiments, unit 40 measures the drain current by pre-charging the bit line of the cell to a certain voltage level. Once the gate voltage is set to the desired value, the drain current causes the bit line voltage to discharge through the cell. Unit 40 measures the bit line voltage several microseconds after the gate voltage is applied, and compares the bit line voltage to the threshold. In some embodiments, each bit line 84 is connected to a respective sense amplifier, which amplifies the bit line current and converts it to a voltage. The voltage is compared to the threshold using a comparator.

The voltage reading method described above is an exemplary method. Alternatively, R/W unit 40 may use any other suitable method for reading the threshold voltages of cells 32. For example, unit 40 may comprise one or more Analog to Digital Converters (ADCs), which convert the bit line voltages to digital samples.

In some embodiments, entire pages (rows) are written and read in parallel. Erasing of cells is usually carried out in blocks that contain multiple pages. Typical memory devices may comprise several hundred thousand pages, each comprising several thousand cells (e.g., 16K or 32K cells per page). A typical erasure block is on the order of 128 pages, although other block sizes can also be used.

The voltages digitized by R/W unit 40 may contain various types of distortion, which are caused by different distortion mechanisms in array 28. Some distortion mechanisms affect the actual electrical charge that is stored in the cells, while other mechanisms distort the sensed voltages. For example, electrical coupling between adjacent cells in the array may modify the threshold voltage in a particular cell. This effect is referred to as interference noise. As another example, electrical charge may leak from the cells over time. As a result of this aging effect, the threshold voltage of the cells may drift over time from the initially-written value.

Another type of distortion, commonly referred to as disturb noise, is caused by a read, write or erase operation on a certain cell in the array, which causes unintended programming or erasure of other cells. As yet another example, the source-drain current of a particular cell can be affected by the charge in adjacent cells, e.g., other cells in the same NAND cell string, via an effect referred to as back pattern dependency.

Distortion/Capacity Trade-Off

Figure 3:
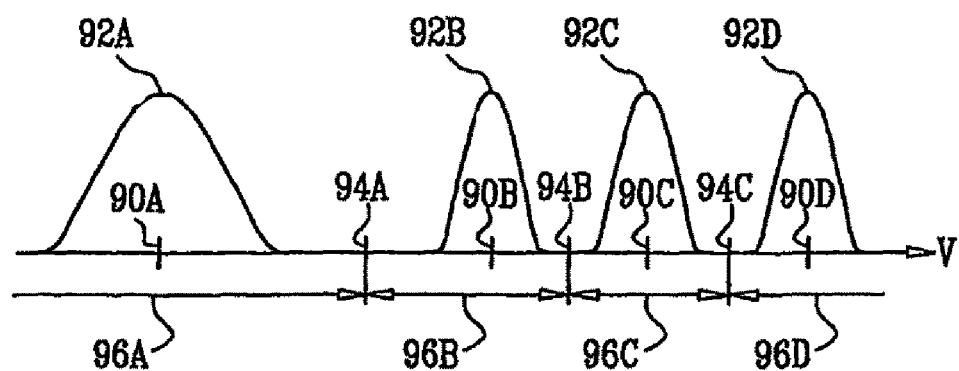
FIG. 3 is a graph showing voltage distribution in an array of multi-level memory cells, in accordance with an embodiment of the present invention.

FIG. 3 is a graph showing voltage distributions in memory cell array 28, in accordance with an embodiment of the present invention. FIG. 3 is used to demonstrate the effect of distortion on the achievable capacity of the memory cells. The memory cells whose voltage distribution is shown in FIG. 3 are configured to each store two bits of information using four nominal voltage levels denoted 90A . . . 90D.

In order to store two data bits in a memory cell, R/W unit 40 writes one of the four nominal voltage levels into the cell. In the present example, voltage level 90A corresponds to "11" bit values, and voltage levels 90B . . . 90D correspond to "01", "00" and "10" bit values, respectively.

Although the R/W unit writes a particular nominal voltage level, the actual threshold voltage level of the cell usually deviates from the nominal level, because of the different distortion mechanisms and because of limited accuracy in the programming and erasing of the cells. Plots 92A . . . 92D show an exemplary voltage distribution. Plot 92A shows the distribution of voltages in the cells that store "11" bit values. Plots 92B, 92C and 92D show the voltage distribution in the cells that store "01", "00" and "10" bit values, respectively. Note that the voltage distribution at the time of reading may differ from the voltage distribution at the time of writing, due to aging and other distortion mechanisms.

The total range of threshold voltages is divided into four intervals 96A . . . 96D by defining three thresholds 94A . . . 94C. When reading the threshold voltage levels of the memory cells, voltage levels that fall within interval 96A are assumed to correspond to "11" bit values. Similarly, voltage levels that fall within intervals 96B . . . 96D are assumed to correspond to "01", "00" and "10" bit values, respectively. Intervals 96A . . . 96D are therefore often referred to as decision intervals, and thresholds 94A . . . 94C are referred to as decision thresholds.

When the voltage that is written in response to certain data bit values falls within the wrong decision interval, the data read out of the cell differs from the data that was written, resulting in a reading error. For a given distortion level, there is a trade-off between the error performance and the achievable capacity of the cells. When the number of nominal voltage levels increases (i.e., the storage density increases), the size of the decision intervals becomes smaller with respect to the distortion effects. As a result, the read voltages are more likely to drift or otherwise fall within erroneous decision intervals, and the error probability increases. For a given error probability, the achievable capacity of a cell drops as the level of distortion increases.

Varying Cell Capacity Across the Memory Cell Array

As noted above, the achievable capacity of a memory cell (i.e., the number of information bits that can be reliably programmed in the cell) depends on the level of distortion of the particular cell. In many practical cases, the achievable capacity differs considerably from one cell to another.

Different cells 32 in array 28 often have different distortion characteristics. For example, some of the cells, such as the cells located on the external perimeter of an erasure block, have fewer neighboring cells, and therefore often have a lower level of cross-coupling noise from adjacent cells. As another example, since programming cells causes interference, disturbs and back pattern dependency errors to previously-programmed cells, cells that are programmed later may suffer from a smaller level of errors than the cells that are programmed earlier. As yet another example, a certain sense amplifier or ADC may introduce a particularly high noise level, which causes the cells along a particular bit line to have higher distortion in comparison with other bit lines. Other distortion characteristics may depend on the history of the programming and erasure operations performed in a particular cell or its environment. Because of these and other factors, the distortion in cells 32, and consequently the achievable capacity of the cells, often varies significantly across array 28.

Figure 4:
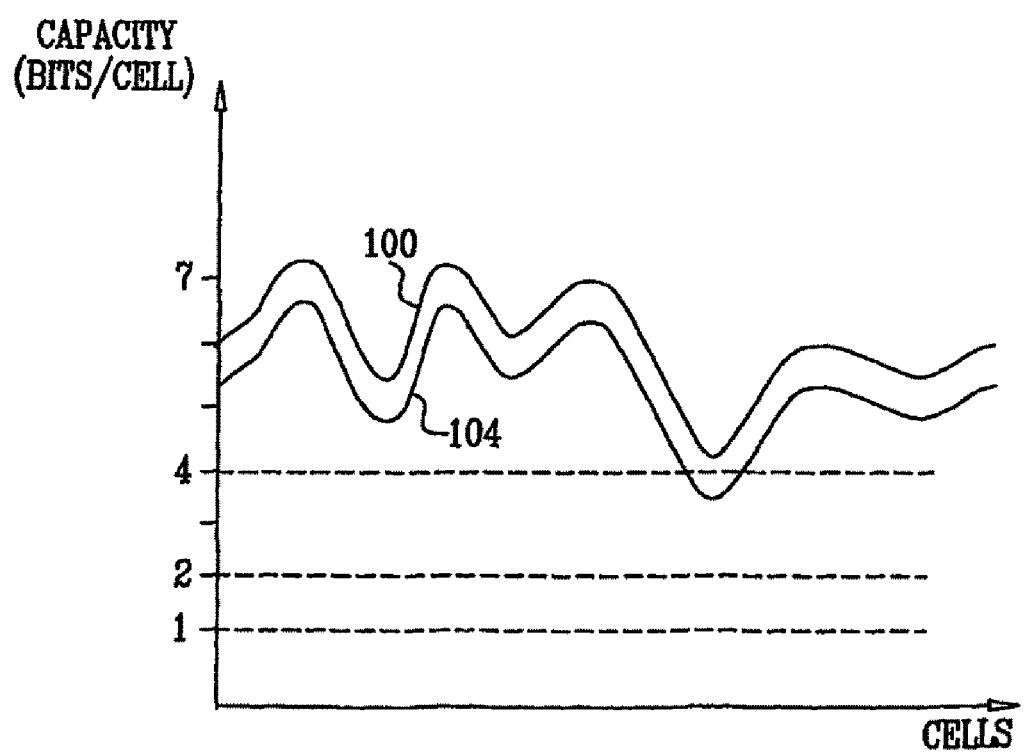
FIG. 4 is a graph showing cell capacity distribution in a memory cell array, in accordance with an embodiment of the present invention.

FIG. 4 is a graph showing an exemplary cell capacity distribution in a memory cell array, in accordance with an embodiment of the present invention. A plot 100 shows the achievable capacity of the different cells. In the present example, the achievable capacity varies between approximately 4.2 and 7.3 bits per cell. A plot 104 shows a practical storage density that may be used for programming the cells, assuming a certain safety margin to guarantee reliable performance over the desired data retention period. As can be seen in the figure, when storage density is allocated individually to each memory cell in accordance with plot 104, the average density achieved is higher than five bits per cell.

If the memory cells of the array of FIG. 4 were allocated fixed storage densities, the entire array would have to be specified as having only three bits per cell, even though most of the cells are capable of achieving much higher capacities. In some known memory devices that use Bad Block Management (BBM) methods, the array could be specified as a four bit-per-cell array, with some groups of cells recognized as faulty. BBM methods are described, for example, in "Bad Block Management in NAND Flash Memories," Application note AN-1819 by STMicroelectronics (Geneva, Switzerland), Nov. 29, 2004, which is incorporated herein by reference.

The methods and systems described herein store data in each cell or group of cells at a density that matches the achievable capacity of the cells. Cells having a lower distortion level are assigned higher capacity, while cells that suffer stronger distortion are assigned lower capacity. The methods and systems described herein track the changes in distortion and capacity during the entire lifetime of the array, and adaptively modify the density in which data is stored in the different cells accordingly.

Cell capacity can be estimated and storage density can be assigned to individual cells or collectively to groups of cells. Assigning separate densities to small groups of cells enables a finer matching of the storage density to the achievable capacity at the expense of more complex management, and vice versa.

Figure 5:
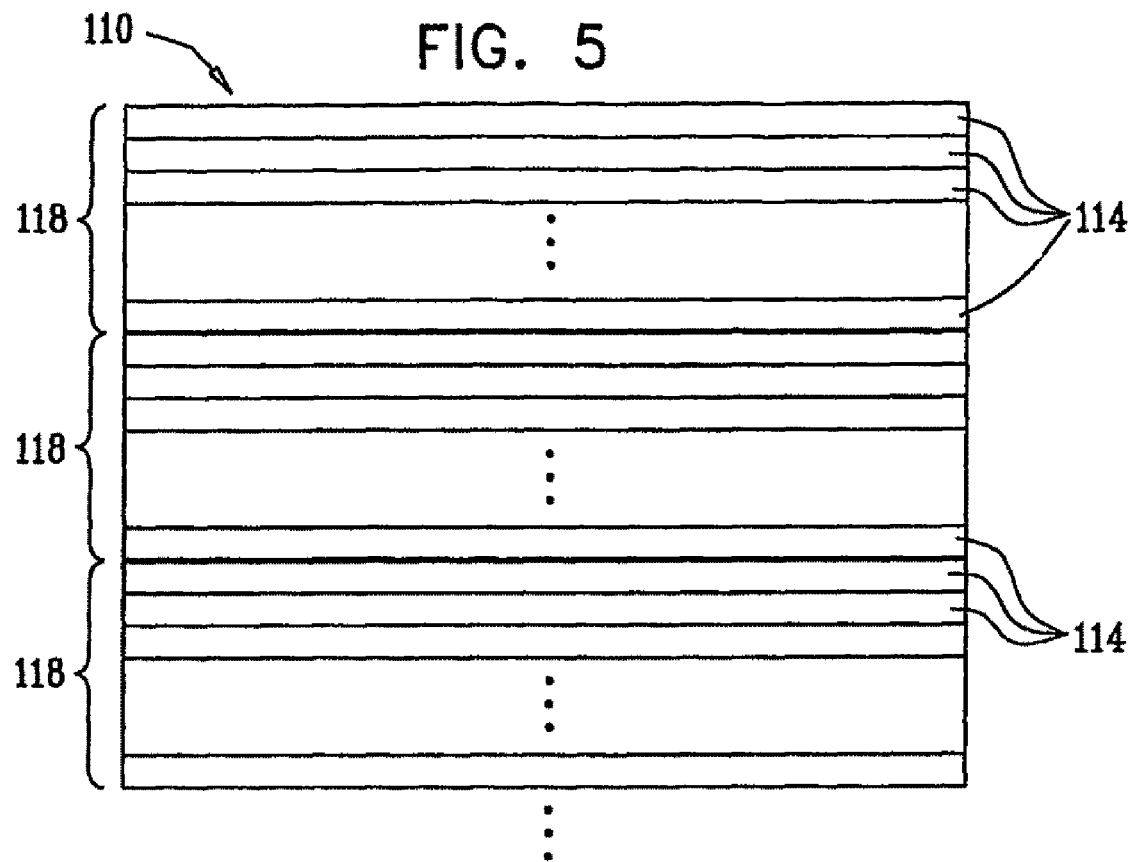
FIG. 5 is a diagram showing block and page structure in a memory cell array, in accordance with an embodiment of the present invention.

FIG. 5 is a diagram showing block and page structure in a memory cell array 110, in accordance with an embodiment of the present invention. Array 110 comprises multiple rows 114. A memory page is defined as a group of memory cells that are written (programmed) simultaneously. In some cases, each page comprises an entire row of Memory cells. In other cases, each row may be divided into several pages. Data is erased from array 110 by simultaneously erasing groups of pages, referred to as erasure blocks 118. For example, a typical page may comprise 16,384 cells and a typical erasure block may comprise one hundred and twenty eight pages, although other sizes can also be used. In some embodiments, each page can be divided into several sectors (not shown in the figure).

In the description that follows, the basic capacity and density allocation unit is a page. In other words, all memory cells in a particular page are programmed using the same number of voltage levels and using the same ECC. Different pages can be assigned different densities by adapting the number of voltage levels and/or the ECC. In alternative embodiments, capacity estimation and density allocation can be performed using groups of cells having any desired granularity, such as on a page-by-page, block-by-block, sector-by-sector or even cell-by-cell basis. In some embodiments, capacity estimation and density allocation is performed jointly for cells connected to a particular bit line 84 or word line 80.

Adaptive Density Allocation Methods

The description that follows illustrates several exemplary methods for estimating the achievable capacity of groups of memory cells 32, e.g. pages, and for adaptively modifying the storage density of memory device 24, in accordance with embodiments of the present invention.

In some embodiments, management unit 76 in MSP 52 holds a storage configuration table, which holds, for each page, a set of parameters that is referred to as a storage configuration. The storage configuration of a particular page determines how data is stored in the page, and may comprise parameters such as the number of voltage levels used for storing data in the memory cells of the page, the values of these voltage levels, the ECC used for encoding the data in the page, and/or any other suitable parameter. In some cases, such as when using Trellis Coded Modulation (TCM) or other coded modulation methods, the selection of ECC and voltage levels is combined. In addition to the storage configuration, the storage configuration table may hold parameters such as the estimated distortion level and the estimated achievable capacity of the page. In some embodiments, initial values of the storage configurations can be stored in the storage configuration table during production.

When writing data into a particular page, MSP 52 queries the storage configuration of the page. The MSP encodes the data using the appropriate ECC and maps the encoded data to the appropriate number of voltage levels, as indicated by the storage configuration of the page. In some embodiments, when reading data from a particular page, the MSP converts the samples produced by R/W unit 40 to hard bit decisions, in accordance with the number of levels indicated by the storage configuration of the page. The MSP then configures the ECC decoder to the ECC indicated in the storage configuration, so as to decode the ECC. Alternatively, e.g., when the decoder comprises a soft decoder, the MSP decodes the samples produced by R/W unit 40 using the soft decoder without generating hard decisions.

The use of different numbers of voltage levels may have an impact on the design of R/W unit 40, such as on the design of comparators, ADCs, DACs, sense amplifiers and associated circuitry. In some embodiments, the sensitivity and resolution of the R/W unit is designed to match the maximum number of voltage levels used. In alternative embodiments, unit 40 can read the threshold voltages from a page in several iterations of increasing resolution (e.g., by using different thresholds in each iteration). Management unit 76 can determine the desired number of iterations, and the resulting resolution, based on the number of levels used for storage in the particular page.

Figure 6:
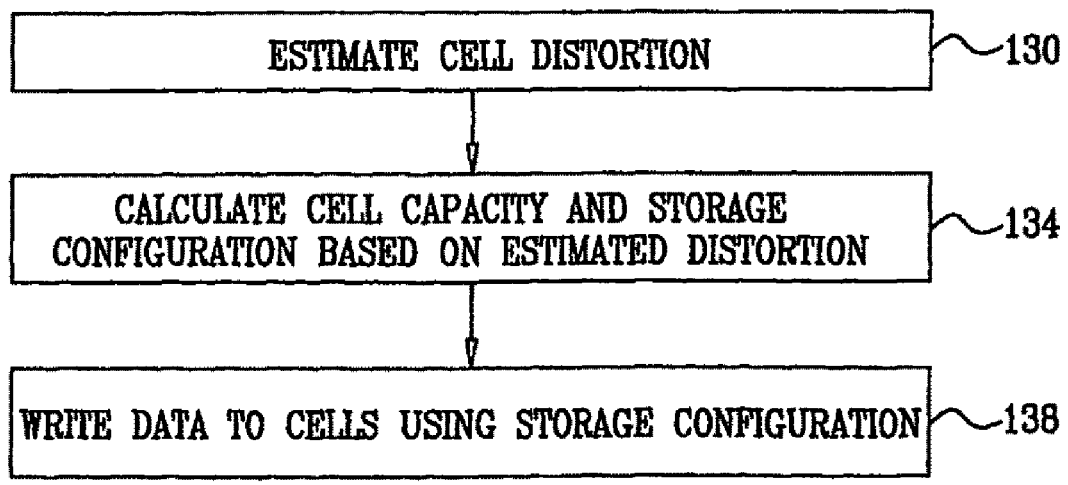
FIGS. 6-11 are flow charts that schematically illustrate methods for adaptively modifying memory device storage density, in accordance with embodiments of the present invention.

FIG. 6 is a flow chart that schematically illustrates a method for adaptively modifying the storage density of memory device 24, in accordance with an embodiment of the present invention. The method begins with MSP 52 estimating the distortion levels in memory cells 32, at a distortion estimation step 130. MSP 52 can use different methods for estimating the cell distortion.

For example, in order to estimate the distortion in a particular target cell, the MSP can read the voltages from neighboring cells, estimate the cross-coupling ratios between the neighboring cells and the target cell, and calculate the cumulative coupling noise contributed by the neighboring cells.

Figure 7:
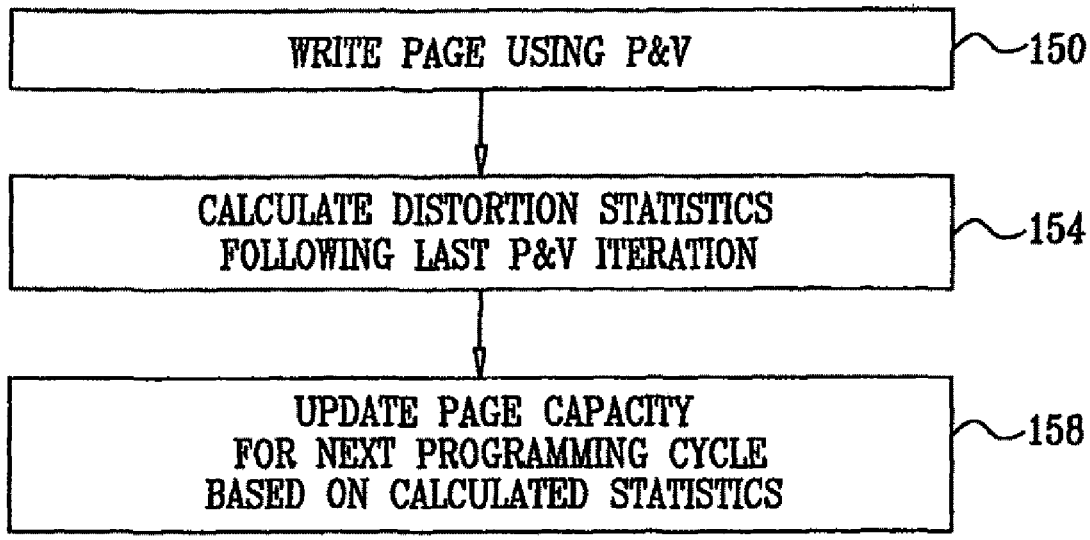
Figure 8:
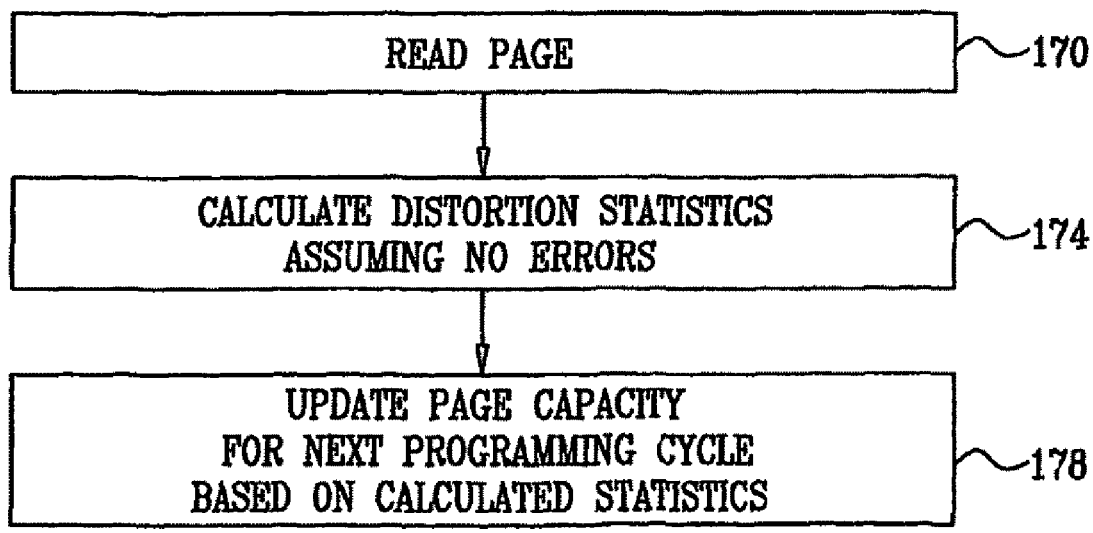

In some embodiments, the MSP can estimate the distortion in a certain page following a programming operation applied to the page. FIG. 7 below shows an exemplary post-writing estimation method. Alternatively, the MSP can estimate the distortion in a certain page following a reading operation applied to the page. FIG. 8 below shows an exemplary post-reading estimation method. Capacity can also be estimated by verifying the reliability of the programmed data, for example by applying increasingly-stronger error correcting codes until error-free storage is achieved. Such a method is described in FIG. 9 below.

Further alternatively, the distortion level can be estimated based on the history of programming and erasure operations the page has gone through. The programming and erasure history can affect the distortion level in a number of ways. Generally, older cells (i.e., cells that have recently gone through a large number of programming and erasing operations) are considered to have a higher leakage current level than younger cells that went through a smaller number of programming and erase operations. Thus, the distortion is also affected by the time that elapsed since the previous programming and erasure operations. An exemplary method for estimating cell capacity based on the history of programming and erasure operations is described in FIG. 11 below.

MSP 52 estimates the page capacity and determines the storage configuration to be used in each page, at a storage configuration calculation step 134. The MSP can use any suitable method for estimating the achievable page capacity based on the estimated distortion, and for selecting the appropriate storage configuration (e.g., number of voltage levels and ECC).

Usually, the MSP leaves a certain safety margin between the estimated capacity and the storage density it sets. The safety margin, which is also referred to as a performance margin, is set to ensure reliable operation over a desired data retention period. Several exemplary methods for determining the appropriate storage configuration are described further below. Unit 76 of MSP 52 updates the storage configuration table with the newly-calculated storage configurations. MSP 52 writes subsequent data to the pages of array 28 using the updated storage configurations, at a writing step 138.

P&V-Assisted Density Allocation

FIG. 7 is a flow chart that schematically illustrates a method for adaptively modifying the storage density of memory device 24 following a Program and Verify (P&V) process, in accordance with another embodiment of the present invention.

P&V processes are commonly used for programming memory cells. In a typical P&V process, a cell is programmed by applying a sequence of voltage pulses, whose voltage level increases from pulse to pulse. The programmed voltage level is read ("verified") after each pulse, and the iterations continue until the desired level is reached or until the operation times out. P&V processes are described, for example, by Jung et al., in "A 117 mm$^2$ 3.3V Only 128 Mb Multilevel NAND Flash Memory for Mass Storage Applications," IEEE Journal of Solid State Circuits, (11:31), November, 1996, pages 1575-1583 and by Takeuchi et al., in "A Multipage Cell Architecture for High-Speed Programming Multilevel NAND Flash Memories," IEEE Journal of Solid-State Circuits, (33:8), August 1998, pages 1228-1238, both of which are incorporated herein by reference.

The method of FIG. 7 can be combined with the normal operation of system 20. In this mode of operation, after a particular group of pages (e.g., a single page or a NAND memory block comprising several NAND strings) is programmed, its distortion level is estimated and its storage configuration is updated for use in the next programming operation. The method begins with MSP 52 programming a particular group of pages using a P&V process, at a P&V programming step 150. Following the last P&V iteration, the MSP calculates the distortion statistics, at a post P&V calculation step 154. The last P&V iteration inherently involves reading the programmed voltage levels of the different cells in the page. The MSP may use these read voltage levels to calculate the level of distortion in the page.

In some cases, the reading resolution used for programming verification is not sufficient for reliable distortion estimation. In such cases, the MSP can read the voltage levels of the programmed group of pages at a higher resolution than the reading resolution of the verify operation.

MSP 52 updates the estimated achievable capacity of the page, at a post P&V update step 158. The MSP uses the calculated distortion level to update the storage configuration of the page, i.e., the appropriate number of voltage levels and ECC. The MSP stores the updated configuration in the storage configuration table, for use in the next programming operation of the page.

In some embodiments, MSP 52 may attempt to increase the page density after programming. In these embodiments, the MSP determines whether the programmed data is sufficiently reliable (i.e., the distortion statistics calculated at step 154 indicate that the margin is sufficiently high to ensure low error probability). If sufficient performance margin exists, the MSP modifies the storage configuration of the page to reflect higher density, by increasing the number of voltage levels and/or the code rate.

When the page storage configuration is determined in conjunction with a P&V process, different trade-offs can be made between the parameters of the P&V process and the storage configuration of the page. In the P&V process, programming speed can be traded for accuracy by varying the voltage increment, or voltage step size, between successive P&V iterations. Setting a higher P&V step size enables programming the page with fewer iterations at the expense of poorer programming accuracy, and vice versa. Such trade offs are described, for example, by Suh et al., in "A 3.3V 32 Mb NAND Flash Memory with Incremental Step Pulse Programming Scheme," IEEE Journal of Solid-State Circuits, volume 30, number 11, November, 1995, pages 1149-1156, which is incorporated herein by reference.

In some embodiments, MSP 52 sets a particular P&V step size value for each page. The P&V step size is stored as part of the storage configuration of the page in the storage configuration table. When programming a particular page, the MSP queries the storage configuration of the page and uses the appropriate P&V step size.

The P&V step size, the number of voltage levels and the ECC can be selected to provide different performance trade-offs. For example, a larger P&V step size enables faster programming at the expense of a higher error probability. As another example, reduced voltage levels also enable faster programming at the expense of higher error probability, as well as enabling lower disturb levels, interference levels, and wear levels. The error probability can be reduced by reducing the number of voltage levels or by introducing a stronger ECC, at the expense of lower storage density. The choice of ECC may have an effect of the MSP complexity. Thus, storage density and/or error performance can be traded for programming speed.

Decision-Directed Density Allocation

FIG. 8 is a flow chart that schematically illustrates a method for adaptively modifying the storage density of memory device 24 following a reading operation, in accordance with yet another embodiment of the present invention.

The method begins with MSP 52 reading a particular memory page from device 24, at a page reading step 170. The MSP calculates the distortion level in the page assuming no errors are present, at a post-read calculation step 174. Typically, the MSP calculates the difference between each soft sample and the corresponding hard decision. Since the assumption is that no decoding errors are present, the difference is attributed to distortion. Note that the hard decisions may be produced by the ECC decoder. The distortion level can be estimated by calculating a sum of scalar functions of the differences between the soft samples and corresponding hard decisions (e.g., a sum of squares of the differences). The distortion can also be estimated by counting the number of cells in which the difference exceeds certain thresholds. In case these thresholds are the threshold levels that are used when reading the cells to obtain the hard decisions, then the distortion estimate comprises the number of errors that were corrected by the ECC.

The MSP updates the estimated achievable capacity of the page, at a post-read update step 178. The MSP uses the calculated distortion level to update the storage configuration of the page in the storage configuration table, for use in the next programming operation of the page. The method of FIG. 8 can be combined with the normal operation of system 20. In this mode of operation, after reading the data a particular page is programmed, its distortion level is estimated and its storage density is updated for use in the next programming operation.

In some embodiments, the MSP can carry out the distortion estimation task during time periods in which the system is idle, in order not to slow down the reading operation.

In some embodiments, the MSP can estimate the distortion level blindly, i.e., without assuming that the hard decisions do not contain errors. For example, when the nominal voltage levels written to the cells are 1V and 3V, if a large number of the read voltages are around 2V, the MSP may conclude that the level of distortion is high even without decoding the data.

Density Adaptation Based on the Reliability of the Programmed Data

In some embodiments, MSP 52 estimates the achievable capacity of a given page by assessing the reliability of the data that is written in the page. In some cases, the MSP adapts the storage configuration of a page without erasing the cells. In these cases, additional data can be written into an existing page in a subsequent programming cycle without erasing the page. The change in density is achieved by modifying the number of voltage levels and/or by modifying the ECC.

Figure 9:
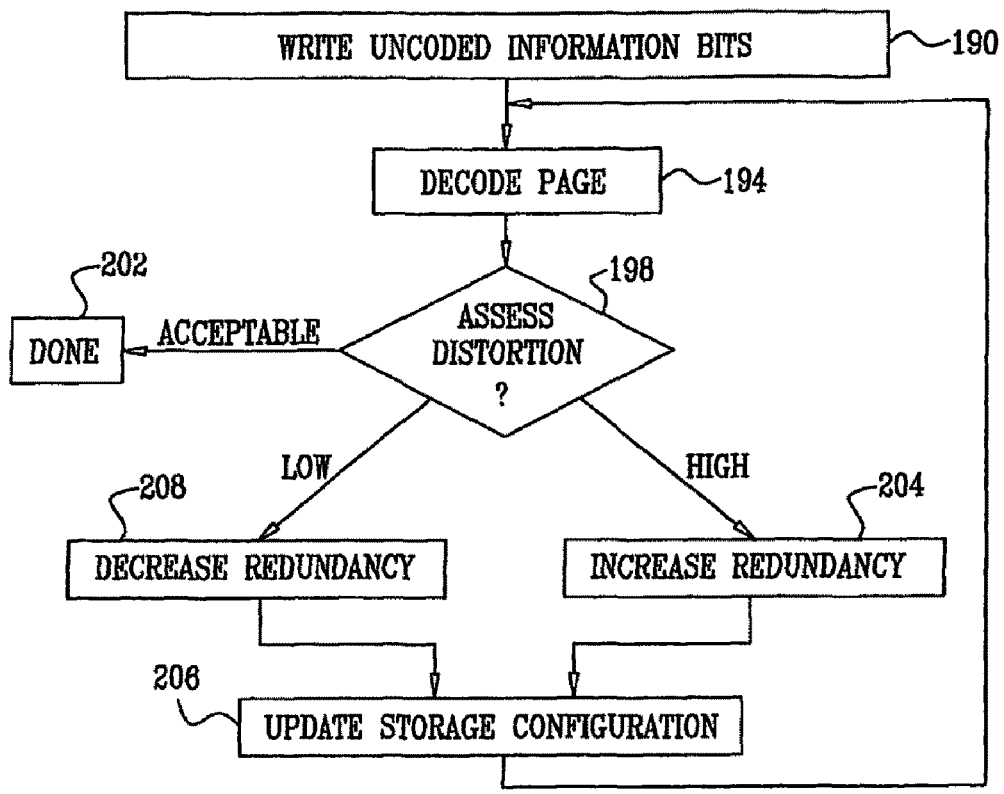

FIG. 9 is a flow chart that schematically illustrates an exemplary method for adaptively modifying the storage configuration of memory device 24, in accordance with an embodiment of the present invention. In the present example, the data is programmed using a systematic ECC (i.e., an ECC that adds redundancy bits based on the uncoded information bits, without modifying the uncoded bits). The storage density and error performance are modified by adapting the number of redundancy bits.

The method begins with MSP 52 programming a particular page without coding, at an encoded programming step 190. Typically but not necessarily, the number of voltage levels is selected so that the storage density slightly exceeds the pre-defined performance margin, i.e., the page may contain some errors.

The MSP reads and optionally decodes the data from the page, at a decoding step 194, and checks the distortion level in the memory cells, at a distortion level checking step 198. The MSP can use different methods and criteria to determine whether the distortion too high, too low or acceptable with respect to the storage configuration that is currently assigned to the page. For example, the MSP may check whether or not the decoded page contains errors that were not corrected by the ECC.

Alternatively, the MSP can evaluate a distance metric between the set of voltages read from the memory cells of the page and valid codewords of the ECC. The MSP may compare the distance from the read voltages to the correct codeword (i.e., the codeword that was actually written to the cells) to the distance from the other codewords. Any suitable distance metric, such as a Hamming metric or a Euclidean metric, can be used for this purpose.

The MSP adapts the storage configuration assigned to the page based on the distortion assessed at step 198. If the distortion level is acceptable, the MSP maintains the current storage configuration and the method terminates, at a termination step 202. If the distortion level is too high, the MSP increases the redundancy level of the ECC (i.e., adds redundancy bits), at a redundancy increasing step 204. Consequently, the density of the page is reduced. The MSP updates the storage configuration table accordingly, at a configuration updating step 206. The method then loops back to step 194 above. If the distortion level is too low (i.e., the storage density can be increased without unacceptably degrading performance), the MSP reduces the redundancy of the ECC, at a redundancy reduction step 208. The MSP updates the storage configuration table at step 206, and the method loops back to step 194 above. The iterations continue until the method converges to the appropriate number of redundancy bits that matches the current distortion level.

Checking the reliability of the programmed data and, if necessary, increasing the number of redundancy bits can be performed occasionally along the lifetime of device 24, such as using the method of FIG. 8 above. As distortion levels change over time, the storage configuration can be adapted accordingly to maintain the desired error performance.

In some embodiments, the storage configuration can be adapted using the method of FIG. 9 without erasing the cells. For example, when the ECC comprises a systematic code, the redundancy bits can be stored separately from the uncoded bits. The number of redundancy bits can be increased or decreased without erasing or re-programming the cells that store the uncoded bits An alternative technique for increasing the storage density of a group of cells (e.g., a page) without erasing cells or programming additional cells involves performing additional programming operations on the already-programmed cells. Consider, for example, a memory cell array in which the cells can be programmed to levels 0 . . . (2n−1), wherein the stored charge level corresponding to level i is smaller than the charge level associated with level i+1.

In some embodiments, m memory cells are initially programmed to even-order levels, i.e., to levels 0, 2, . . . 2n−2. After estimating the distortion level in the cells, the MSP encodes additional bits of information using a binary encoder, which generates m encoded bits. The code-rate of the encoder depends on the estimated distortion. The MSP re-programs (without erasing) the cells for which the encoded bit is '1' to odd-order levels, i.e., to levels 1, 3, . . . 2n−1. For example, the new cell level can be written as y(m)=x(m)+b(m), wherein y(m) denotes the new level of cell m, x(m) denotes the previous level of the cell, and b(m) denotes the value of the $m^{th}$ encoded bit ('o' or '1'). This scheme can be regarded as an adaptive-rate Trellis Coded Modulation (TCM) that is adapted responsively to the estimated distortion.

Finite Sets of Storage Configurations

In some embodiments, MSP 52 selects an appropriate storage configuration (e.g., number of levels and ECC scheme) for each page from a predetermined set of storage configurations. The use of a finite set of storage configurations reduces the complexity of the MSP, and in particular simplifies the storage configuration table in unit 76.

Figure 10:
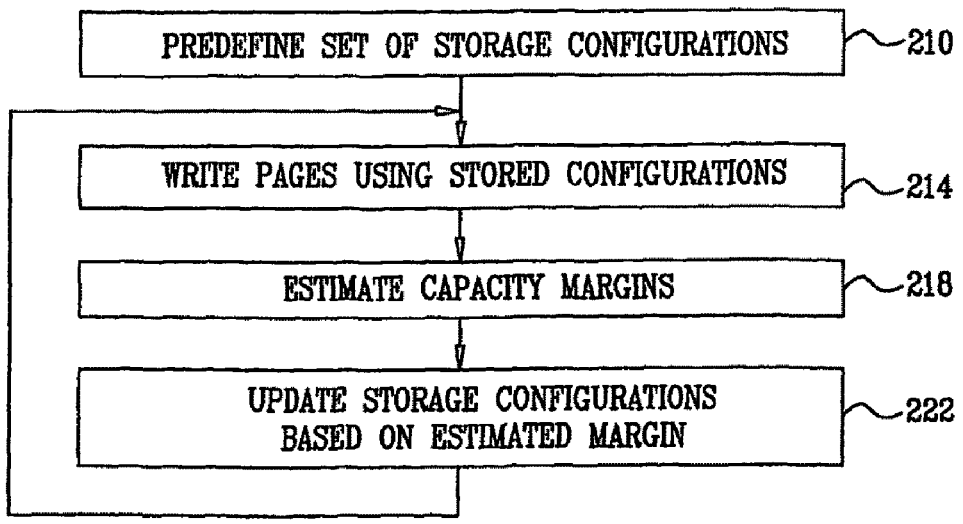

FIG. 10 is a flow chart that schematically illustrates a method for adaptively modifying the storage density of memory device 24 using a finite set of storage configurations, in accordance with an embodiment of the present invention. The method begins by predefining a set of storage configurations, at a definition step 210. Each storage configuration specifies a particular number of voltage levels and a particular ECC scheme. Thus, each storage configuration defines a certain storage density, i.e., a certain bit-per-cell value.

Note that the number of bits per cell need not necessarily be integer, since (1) the mapping of data bits to voltage levels can be performed jointly on groups of cells and not on individual cells, and (2) the number of voltage levels may not be a power of two. Exemplary methods for implementing fractional bit-per-cell storage density are described further below. The following table shows an exemplary set of ten storage configurations:

| Storage configuration | Bits/cell | Levels/cell |
|---|---|---|
| 0 | N/A | N/A |
| 1 | 1 | 2 |
| 2 | ~1.5 | 3 |
| 3 | 2 | 4 |
| 4 | ~2.5 | 6 |
| 5 | 3 | 8 |
| 6 | ~3.5 | 12 |
| 7 | 4 | 16 |
| 8 | ~4.25 | 20 |
| 9 | ~4.5 | 24 |

Storage configuration 0 identifies bad pages, which are not used. Configurations 1-9 provide nine different density levels, between 1 and 4.5 bits per cell. In alternative embodiments, any other suitable set of storage configurations can be used.

Typically, the storage configuration table in management unit 76 is initialized with a certain default storage configuration from the predefined set. When writing a particular page, MSP 52 encodes and maps the data using the ECC and number of levels specified by the storage configuration of the page, at a page programming step 214.

Following a programming operation or following a reading operation, the MSP estimates the performance margin of the page, at a margin estimation step 218. The MSP may estimate the performance margin by measuring the distortion in the voltages read from the page or by assessing the reliability of the data read from the page, as described above. The margin may be expressed in terms of Signal-to-Noise Ratio (SNR) or using any other suitable metric.

The MSP uses the performance margin to determine whether the storage configuration specified for the page matches the current capacity of the page, or whether the storage density should be increased or decreased. For example, the MSP may compare the estimated margin to a threshold.

If the estimated margin indicates that the storage configuration should be modified, the MSP selects a different configuration from the predefined set, at a configuration updating step 222. The MSP updates the configuration selection in the storage configuration table, so that subsequent programming operations on this page will use the updated storage configuration.

In some embodiments, MSP 52 compresses the data to be stored in a particular page before ECC encoding. Any compression method known in the art, which may be lossless or lossy, may be used for this purpose. The combination of compression and ECC encoding can produce different storage densities, i.e., different bit-per-cell values.

In some embodiments, the total number of bits stored in each page (denoted M) remains constant in the different storage configurations, and the number of net information bits (denoted K) is variable. For example, assume that a page comprises 4,224 memory cells, and that the cells are programmed using sixteen voltage levels (i.e., each cell stores four bits). The total number of bits stored in a page is 4,224·4=16,896. With an ECC coding rate of 7/8, the number of net information bits that can be stored in a page is 14,784. With a lower ECC coding rate of 13/16, the number of net information bits that can be stored in a page is 13,728. The second storage configuration is, however, more robust due to the stronger ECC.

Alternatively, the number of voltage levels per memory cell can vary from one storage configuration to another, i.e., both K and M are varied. For example, the following table shows three storage configurations for use in an array of 4,224-cell pages:

| Voltage levels per cell | Stored bits per cell | ECC rate | K | M | Net info bits per cell |
|---|---|---|---|---|---|
| 16 | 4 | 7/8 | 14,784 | 16,896 | 3.5 |
| 12 | 3.5 | 13/14 | 13,728 | 14,784 | 3.25 |
| 12 | 3.5 | 6/7 | 12,672 | 14,784 | 3 |

In some embodiments, each page is divided into sectors having a constant number of net information bits. The number of sectors per page is varied. For example, the following table shows three storage configurations for use in an array of 4,224-cell pages. In the present example, each sector contains 1,412 net information bits that are encoded using a rate 2/3 ECC to produce 2,118 stored bits.

| Sectors per page | K | M | Levels per cell | Stored bits per cell |
|---|---|---|---|---|
| 8 | 11,264 | 16,896 | 16 | 4 |
| 7 | 9,856 | 14,784 | 12 | 3.5 |
| 6 | 8,448 | 12,672 | 8 | 3 |

Capacity Estimation Using Program/Erase History

As noted above, the level of distortion in a particular memory cell 32 may depend on the history of programming and erasure operations the cell has gone through. Thus, MSP 52 typically assigns storage configurations having lower storage densities to older cells, and vice versa.

In some cases, distortion is caused by the leakage current of the cells. The effects of leakage current are described, for example, by Mielke et al., in "Recovery Effects in the Distributed Cycling of Flash Memories," IEEE Annual International Reliability Physics Symposium, San Jose, Calif., March, 2006, pages 29-35, which is incorporated herein by reference. According to this paper, dielectric damage caused by programming and erasure cycling partially recovers during the delays between cycles. The paper characterizes the effect of these delays on the charge-detrapping data-retention mechanism. Thus, the level of distortion that is associated with leakage current depends on the length of time that that elapsed from the occurrence of previous programming and erasure operations. Other types of distortion may also be influenced by charge trapping, and thus by recent programming and erasure operations. For example, the level of disturb errors may increase in memory cells having a high number of charge traps.

Figure 11:
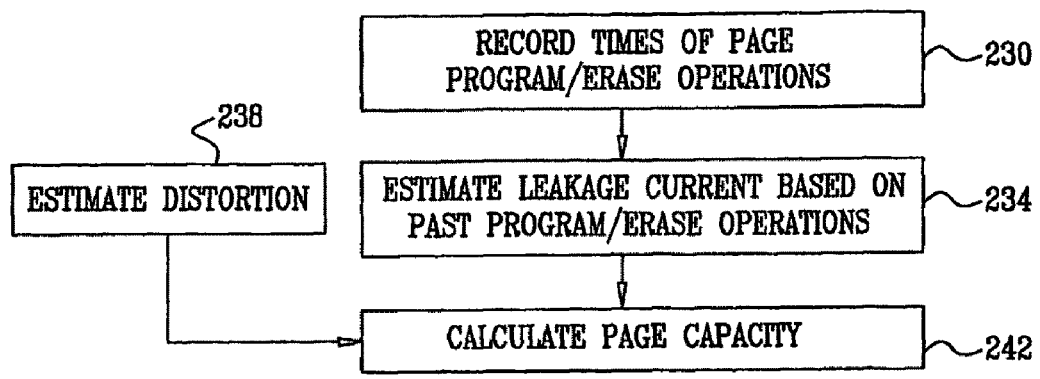

FIG. 11 is a flow chart that schematically illustrates a method for adaptively modifying the storage density of memory device 24 based on the history of programming and erasure operations, in accordance with an embodiment of the present invention. The method begins with management unit 76 of MSP 52 recording the times in which programming and erasure operations were performed on the different memory cells 32 of array 28. The MSP may maintain a running counter that tracks the current time in order to time-tag the programming and erasure operations. Alternatively, in some cases the time tags are provided by memory controller 22.

Since programming operations are typically performed page-by-page and erase operations are performed on entire erasure blocks, the MSP can record the programming and erasure times per page. The information can be stored as part of the storage configuration of each page in the storage configuration table. Erasure times can be stored either per page or per erasure block.

MSP 52 estimates the leakage current in a particular page, at a leakage estimation step 234. The MSP can use various estimators and criteria to estimate the leakage current based on the recorded programming and erasure times. For example, the leakage current can be estimated by the function $$I_{Leakage} = a_0 \cdot CurrentTime + \sum_{n=1}^{K} a_i ProgramTime(n)$$

wherein ProgramTime(n) denotes the time of the n'th programming operation performed on the page, as recorded at step 230 above. CurrentTime denotes the time in which the estimate is calculated. $\alpha_0 \ldots \alpha_K$ denote weighting coefficients, which typically assign a higher weight to more recent programming operations. When $a\alpha_i=0$ for i>1, the estimate is based only on the last programming operation.

In alternative embodiments, the leakage current can be estimated based on the number of erase operations performed in a certain time interval (e.g., in the last day, hour or minute). Further alternatively, the leakage current can be estimated iteratively, such as using the function $$I_{Leakage}(n+1) = (1-\delta) \cdot I_{Leakage}(n) + \delta \cdot [ProgramTime(n+1) - ProgramTime(n)]$$

wherein $0 < \delta < 1$ denotes a weighting coefficient or "forgetting factor." The iterative estimation enables MSP 52 to record only the times of last two programming operations and the value of the previous estimate, rather than storing a list of multiple time tags.

Alternatively, the MSP can use any other estimate of method for estimating the leakage current based on the recorded history of programming and erase, operations.

In some embodiments, the MSP estimates the cell distortion based on other factors, at a complementary distortion estimation step 238. The distortion estimation can be based on measuring cross-coupling ratios from neighboring cells or on any other suitable process.

The MSP combines the leakage current estimation performed at step 234 above with the distortion estimation performed at step 238 above and estimates the capacity of the page, at a capacity estimation step 242. For example, the capacity can be estimated using the function Capacity = $C_0 + \beta \cdot I_{Leakage} + \gamma \cdot$ DistortionEstimate wherein $C_0$ denoted a baseline capacity value, and $\beta$ and $\gamma$ denote weighting coefficients that assign the desired relative weights to the leakage current and distortion estimates. In some embodiments, step 238 may be omitted and the MSP may estimate the page capacity based only on the leakage current estimate, such as by setting $\gamma=0$.

MSP 52 updates the storage configuration table with the updated page capacity values. The MSP may determine the page density and the appropriate storage configuration (e.g., ECC and number of voltage levels) for this page using any suitable method, such as the methods described hereinabove.

Density Allocation with Fractional Bit-Per-Cell Values

In some embodiments, MSP 52 can define storage configurations having a non-integer number of bits per cell. For example, in some cases it is possible to increase the storage density and approach the achievable capacity of a cell by using a number of voltage levels that is not a power of two. MSP 52 can use various methods for mapping data bits to voltage levels, when the number of bits per cell is not integer.

Let K denote the number of voltage levels used for storing data in a particular page. K is not necessarily a power of two, thus the storage density is not necessarily integer. The maximum number of bits that can be represented by the K levels is given by $n_{opt} = \log_2(K)$, which is generally a non-integer value. In order to reaching this optimal storage density, an infinite number of data bits would need to be stored in an infinite number of memory cells, and the process would involve infinite delay. In practical scenarios, however, the deviation from the optimal storage density can be traded for processing delay (i.e., the number of cells used for storing the data).

Let $n_c$ denote the number of memory cells used to store the data, and $n_{tb}$ denote the total number of bits stored in the $n_c$ cells. $n_c$ and $n_{tb}$ are both integer values. The storage density is thus given by $n_{bpc} = n_{tb}/n_c \cdot n_{th}$ and $n_c$ should be chosen so that the deviation from optimal density, given by $n_{gap} = n_{bpc} - n_{opt}$, is non-negative and minimized. Increasing $n_c$ enables $n_{bpc}$ to approach $n_{opt}$, but increases the mapping complexity and the processing delay.

Having selected the desired values of $n_c$ and $n_{th}$, MSP 52 maps each group of $n_{tb}$ data bits to $n_c$ voltages, which are in turn written into $n_c$ memory cells. Each of the $n_{th}$ voltages can take one of K possible levels. The $n_{tb}$ data bits are denoted $b_1, \ldots, b_{n_{tb}} \in \{0,1\}$.

In some embodiments, MSP 52 maps the $n_{th}$ data bits to the $n_c$ voltages by representing the $n_{tb}$-bit binary number expressed by the bits in K basis. In other words, MSP 52 determines $n_c$ coefficients $k_1, \ldots, k_{n_c} \in \{0, \ldots, K-1\}$, such that $$b_{n_{tb}} \cdot 2^{n_{tb}-1} + b_{n_{tb}-1} \cdot 2^{n_{tb}-2} + \ldots + b_2 \cdot 2 + b_1 = k_{n_c} \cdot K^{n_c-1} + k_{n_c-1} \cdot K^{n_c-2} + \ldots + k_2 \cdot K + k_1$$

MSP 52 then programs the $n_c$ memory cells with the values $k_1, \ldots k_{n_c}$.

For example, let K=11. The optimal storage density in this case is $n_{opt} = \log_2(11) 3.4594$. Assuming data is written in groups of $n_c=3$ cells, the deviation from optimal density is $n_{gap} \approx 0.1261$ and $n_{tb}=10$. Thus, sequences of ten data bits are mapped to groups of three memory cells, each using eleven voltage levels. For example, the bit sequence "1101100100" is mapped to $k_1=7$, $k_2=1$ and $k_3=10$.

Storing and Erasing Data in a Variable-Capacity Memory Device

Figure 12:
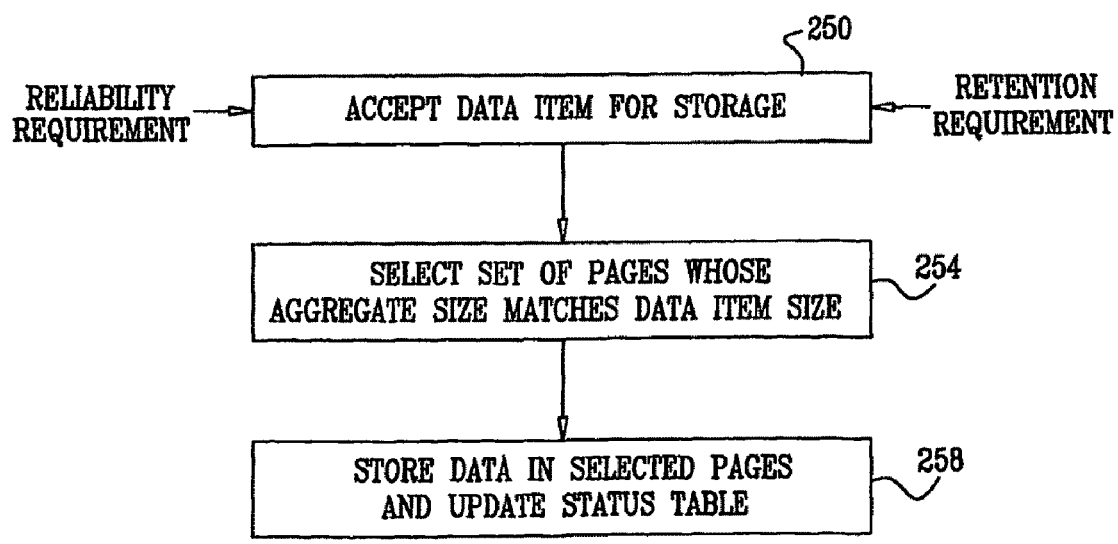
FIG. 12 is a flow chart that schematically illustrates a method for storing data in a variable-capacity memory device, in accordance with an embodiment of the present invention.

FIG. 12 is a flow chart that schematically illustrates a method for storing data in a variable-capacity memory device, in accordance with an embodiment of the present invention. The method begins with MSP 52 accepting a data item for storage from memory controller 22, in an input step 250.

In some embodiments, the memory controller specifies a certain reliability requirement for storing the data item. The memory controller may use any suitable method or form for specifying the requested storage reliability, such as by explicitly specifying a maximum tolerated error probability or by selecting a reliability level from a set of predefined levels. Often but not necessarily, the reliability requirement is associated with the error-tolerance of the application that generated the data item. For example, a file containing audio or video media may be stored at a relatively low reliability level. Files containing program code and operating system data files, on the other hand, will usually be specified with a high reliability level.

Additionally or alternatively, the memory controller may specify a certain retention requirement for storing the data item. The retention requirement indicates the time period over which the data item is expected to be stored. For example, temporary operating system files can be specified with a low retention period.

MSP 52 selects a set of one or more pages in array 28 in which to store the data item, at a page selection step 254. Typically, management unit 76 tracks the status of each memory page. Each page may have a status of "erased" (i.e., available for programming), "contains information," "faulty" or "ready for erasing." As noted above, unit 76 also holds the storage configuration (e.g., the number of voltage levels and ECC) used in each page, which defines the amount of data that can be stored in the page.

Unit 76 selects a set of one or more "erased" pages whose aggregate size is sufficient for storing the data item. In some embodiments, unit 76 scans through the "erased" pages in sequential order and selects pages until their aggregate size is sufficient for storing the data item. Alternatively, unit 76 may apply various policies or criteria for selecting pages.

For example, unit 76 may select pages that have gone through a relatively low number of programming and erasure cycles, in order to achieve better wear leveling across array 28. As another example, unit 76 may search for a set of pages whose aggregate size provides the closest match to the size of the data item (i.e., exceeds the size of the data item by as little as possible), in order to minimize the number of unused memory cells. As yet another example, Unit 76 may give preference to high-capacity pages, in order to split the data item among a minimal number of pages and reduce programming time, wearing and management overhead. Alternatively, unit 76 may use any other suitable criterion or combination of Criteria when selecting pages for storage.

In some embodiments, unit 76 modifies the storage configuration (and thus the storage density) of the pages based on the reliability and/or retention requirements specified for the data item. For example, when the data item has a relatively low reliability and/or retention requirement, unit 76 may store the item in cells having higher distortion and/or at a higher density with respect to the distortion level of the cells.

MSP 52 stores the data item in the selected pages, at a storage step 258. Unit 76 sets the status of the pages used for storage to "contains information," and updates the storage configuration of the pages if necessary. Unit 76 also records the identities of the pages used for storing the data item, so that these pages can be addressed when system 20 is later requested to retrieve the data item.

In some embodiments, system 20 can be requested by memory controller 22 to report the available memory size. In these embodiments, unit 76 sums the capacities of the pages marked as "erased" and reports the result as the available memory size.

Figure 13:
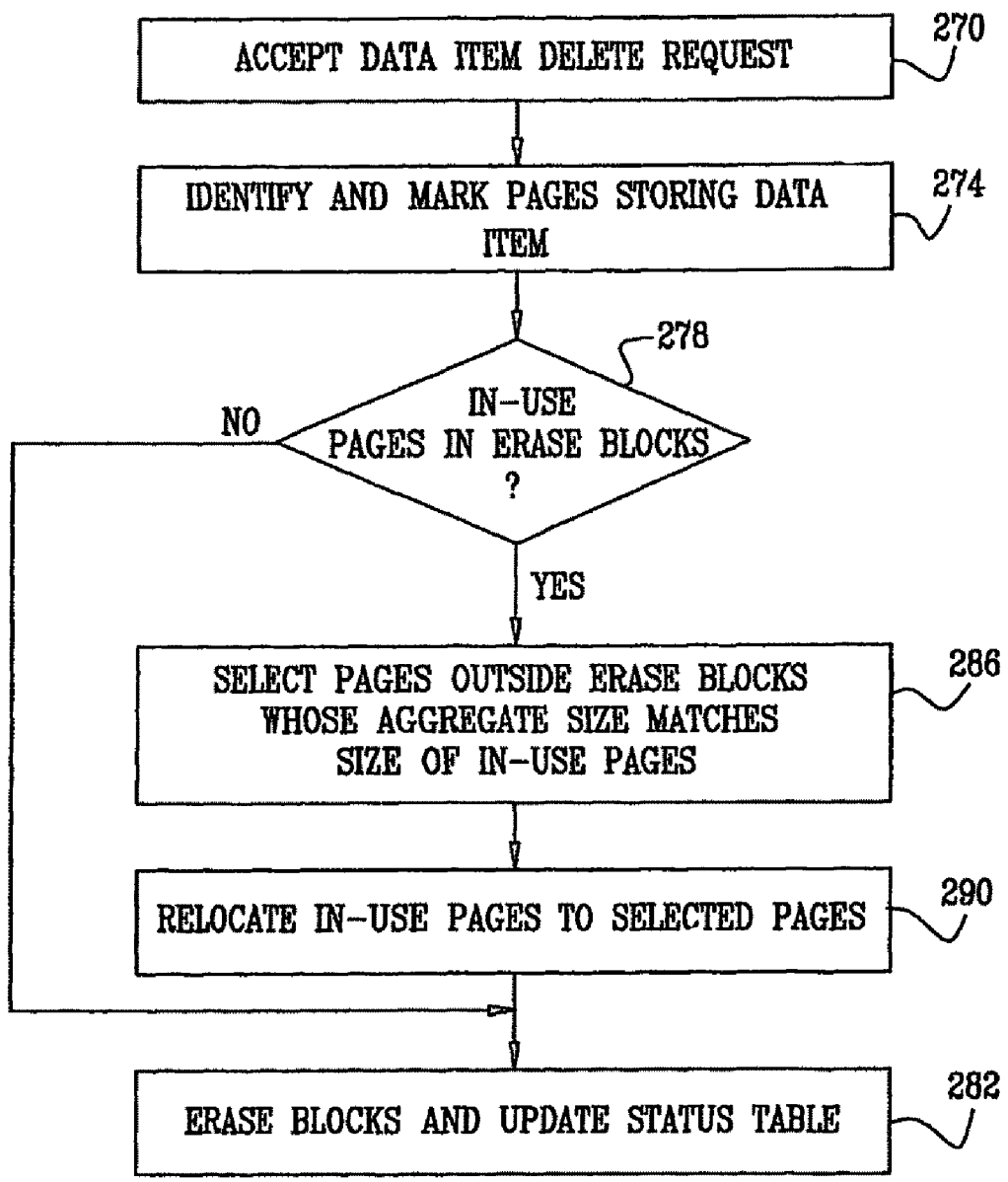
FIG. 13 is a flow chart that schematically illustrates a method for erasing data from a variable-capacity memory device, in accordance with an embodiment of the present invention.

FIG. 13 is a flow chart that schematically illustrates a method for erasing data from a variable-capacity memory device, in accordance with an embodiment of the present invention. The method begins with MSP 52 accepting a request from memory controller 22 to delete a certain data item from memory device 24, at a delete requesting step 270. Management unit 76 in MSP 52 identifies the pages used for storing the data item and marks them as "ready for erasing," at a deletion step 274.

The pages that store the data item may be located in one or more erasure blocks. Before these blocks can be erased, any pages in these blocks that are in use (i.e., have "containing information" status) should be relocated to other erasure blocks.

Unit 76 checks whether the erasure blocks that contain the pages identified at step 274 above contain in-use pages, at an in-use checking step 278. If the erasure blocks do not contain any in-use pages, unit 76 erases the blocks and updates the status of the pages in these blocks to "erased," at an erasure step 282. If, on the other hand, unit 76 detects that some pages in the blocks intended for erasure are in use, it relocates the data stored in these pages to other pages, outside the blocks intended for erasure. (In some cases, unit 76 may decide not to erase the block, such as when an erasure block contains a single page belonging to the erased data item and all other pages are already erased.)

Unit 76 selects a set of one or more pages, which are located outside the blocks intended for erasure and whose aggregate size is sufficient for storing the data in the in-use pages, at a relocation selection step 286. Unit 76 can select the pages to which data is relocated in accordance with any suitable policy or criteria. For example, the pages can be selected out of the available pages in sequential order. Alternatively, unit 76 may select the pages so as to improve wear leveling or to reduce the number of unused memory cells, as described in page selection step 254 of the method of FIG. 12 above. Further alternatively, unit 76 can use any other suitable criterion.

Unit 76 copies the data stored in the in-use pages to the pages selected at step 286 above, at a relocation step 290. Note that the relocation operation does not necessarily preserve the number of pages or the partitioning of data into pages. Since the pages in device 24 have different capacities, the relocated data can be copied to a different number of pages and/or partitioned among the pages in a different manner with respect to the original storage. Once the data is relocated, the blocks identified at step 274 above are erased, at erasure step 282.

Data Storage Management in Variable-Capacity Memory Devices

As noted above, MSP 52 interacts with memory controller 22, i.e., accepts data for storage from the memory controller and outputs data that is stored in memory to the memory controller when requested. System 20 can interact with the memory controller or generally with the host system in several ways, which differ from one another in the level of management functionality carried out by the MSP.

At one extreme, system 20 interacts with a legacy memory controller, which is designed to control fixed-capacity memory devices. The memory controller in this case maintains a fixed-capacity page table, indicating which fixed-capacity pages are used for storing each data item. The fixed-capacity page table may also hold the status of each fixed-capacity page or block, and indicate whether a certain erasure block is considered to be a bad block.

In these embodiments, MSP 52 mediates between the adaptive capacity characteristics of system 20 and the fixed capacity characteristics of memory controller 22, by maintaining two parallel indexing schemes. Towards the memory controller, the MSP communicates using the indexing scheme of the fixed-capacity pages, so that system 20 appears to be a fixed-capacity device to the memory controller. Internally in system 20, MSP 52 stores the data items efficiently in variable-capacity pages. The MSP maintains a separate indexing scheme of variable-capacity pages, which indicates which variable-capacity pages are used to store each data item. The MSP is able to translate between the two indexing schemes when writing and reading data.

In some cases, memory controller 22 also carries out functions such as ECC encoding and decoding, detection of errors in the data read from memory and/or bad block management. Using the techniques described herein, known memory controllers can be used to control memory device 24 without having to modify their data structures or protocols.

At the other extreme, the functionality of memory controller 22 is substantially carried out by MSP 52 itself. In these embodiments, the MSP accepts data items of arbitrary sizes from the host system (e.g., from a computer CPU), and stores the data items in the variable-capacity pages of array 28. Since the memory management functions are carried out by the MSP, there is no need to emulate fixed-capacity indexing, and only one indexing scheme is maintained by the MSP.

Further alternatively, MSP 52 may support any other suitable division of memory management functions between system 20 and the host system. A single MSP device may support different interfacing and indexing schemes in order to interact with different types of memory controllers or hosts.

FIGS. 14-17 are diagrams that schematically illustrate methods for storing fixed-size data blocks in a variable-capacity memory device, in accordance with embodiments of the present invention.

Figure 14:
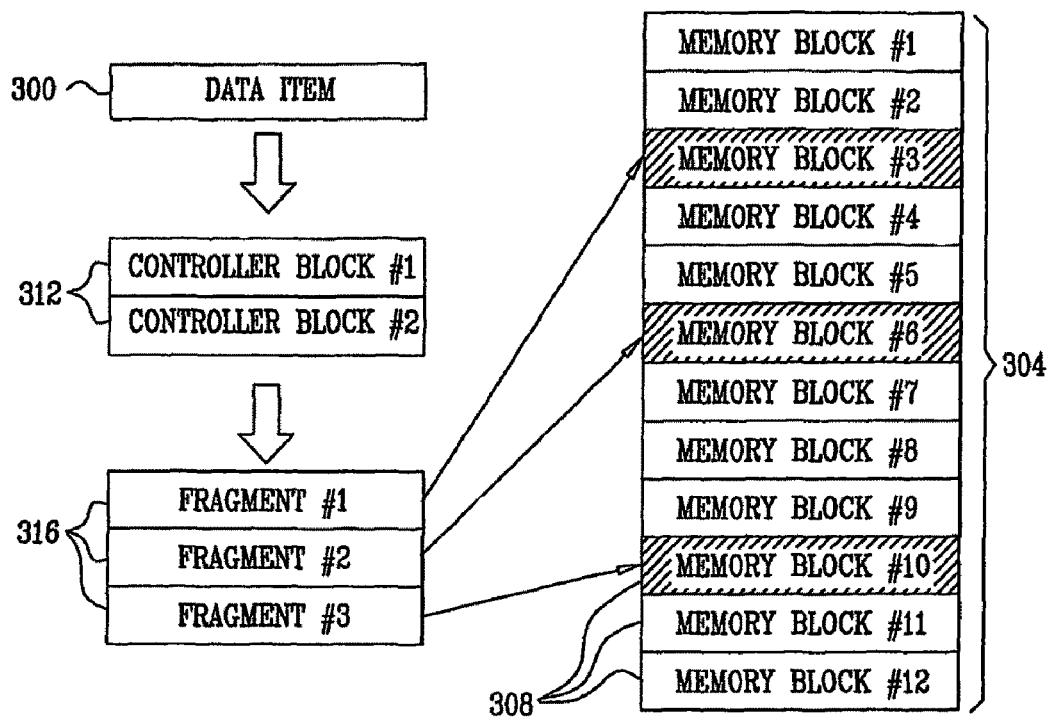
FIGS. 14-17 are diagrams that schematically illustrate methods for storing fixed-size data blocks in a variable-capacity memory device, in accordance with embodiments of the present invention.

FIG. 14 illustrates a method for interacting with a memory controller, which is designed to store data in memory devices having erasure blocks having a fixed number of cells, and which carries out a Bad Block Management (BBM) function. In some known BBM methods, a certain erasure block is classified as a bad block even if only a single page in the block is faulty. Such methods are extremely inefficient, since most of the memory cells in a bad block are still usable. Using the method of FIG. 14, on the other hand, system 20 stores data efficiently in the usable memory cells of blocks classified as bad.

In a typical writing operation, memory controller 22 accepts a data item 300 for storage in a memory array 304. Array 304 comprises multiple memory blocks 308. Memory controller 22 divides the data item into one or more fixed-size blocks, which are referred to as controller blocks 312. Each controller block 312 is destined for storage in a certain available memory block 308. Memory controller 22 provides controller blocks 312 to MSP 52 for storage.

Some of blocks 308 may have reduced capacity (i.e., capacity that is smaller than the size of controller blocks 312) due to distortion effects, manufacturing faults or for any other reason. Using known BBM methods, such blocks would have been classified as bad blocks and remained unused, even though the vast majority of their memory cells may still be usable.

MSP 52, on the other hand, regards all memory blocks 308 as variable-capacity blocks and does not classify blocks as good or bad. The MSP extracts the data from the controller blocks and re-partitions the data into multiple fragments 316, which may be of the same size or of different sizes. The MSP identifies multiple memory blocks 308 whose capacities match the sizes of fragments 316, and stores each fragment in a respective memory block. In the present example, the MSP divides the data item into three fragments and stores the fragments in the memory blocks denoted #3, #6 and #10.

MSP 52 may use various methods and criteria to determine the blocks in which to store each data item. For example, the MSP may search for a pair of memory blocks having reduced capacity, whose aggregated capacity is sufficient to store the data of a single controller block. The MSP then maps the controller block to the pair of memory blocks. As another example, the MSP may search the available memory blocks and determine a set of two or more blocks 308, whose aggregated capacity best matches the size of data item 300. Using this method, the amount of wasted memory is minimized.

Alternatively, the MSP may search for a set having a minimum number of blocks in which the data item can be stored, in order to reduce management overhead. Further alternatively, the MSP may select blocks that have gone through a minimum number of recent programming and erasure cycles, in order to improve wear leveling. Any other suitable method or criterion can also be used in some embodiments, a single memory block 308 can be used to store fragments belonging to more than one data item.

The partitioning of data item 300 into fragments 316 can be performed either independently of or in connection with the selection of memory blocks 308. For example, the MSP may first fragment the data item into fixed-size fragments, regardless of the number and identity of the memory blocks in which the fragments will ultimately be stored in. Alternatively, the MSP may first identify the memory blocks in which the data item is to be stored, and then fragment the data item according to the number and size of these memory blocks.

In some embodiments, MSP 52 emulates storage in fixed-capacity blocks toward the memory controller, such that the fragmentation performed by the MSP is transparent to the memory controller and its BBM function. For example, the MSP may maintain two indexing tables, i.e., an indexing table of fixed-size controller blocks and a corresponding indexing table of variable-capacity memory blocks. Whenever a data item is sent by the memory controller for storage in a certain set of controller blocks, the MSP indicates which variable-capacity memory blocks are used for storing the item. When the data item is requested by the memory controller, the MSP retrieves the item from the variable-capacity memory blocks in which it was stored, and sends the item to the memory controller, as if it was stored in the fixed-size controller blocks known to the controller.

As can be appreciated, the method of FIG. 14 increases the achievable capacity of the memory device considerably with respect to known BBM methods, since it enables data to be stored in memory blocks that would have otherwise been classified as bad blocks.

Although the description of FIG. 14 referred to a storage granularity of entire erasure blocks, the method can also be implemented using finer granularity, i.e., page granularity. In other words, the MSP can determine a suitable set of variable-capacity memory pages in which the data item can be stored.

Fragmenting and storing data items on a page-by-page basis enables higher storage density at the expense of relatively high management overhead.

In an exemplary implementation, when the nominal page size used by the memory controller is P bits, the MSP classifies the memory pages in the memory device into reduced-capacity memory pages whose capacity is smaller than P, and nominal-capacity memory pages whose capacity is greater than or equal to P. The MSP can then store each controller page having P bits either in a nominal-capacity memory page, or in a pair of reduced-capacity memory pages. The MSP typically maintains a table that maps each controller page to the corresponding nominal-capacity memory page or pair of reduced-capacity memory pages. Thus, memory pages whose capacity falls below the nominal size of the controller page can still be used for storing data.

Figure 15:
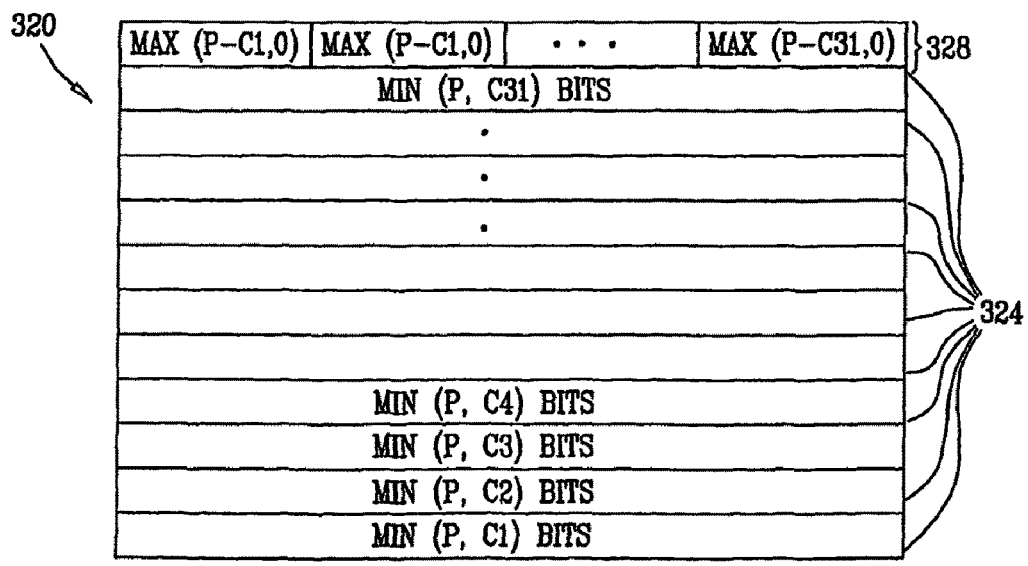

FIG. 15 illustrates another method for efficiently storing fixed-size controller pages having P bits in variable-capacity memory pages, in accordance with an embodiment of the present invention. A memory array 320 comprises multiple memory pages 324. A memory page is defined as a group of memory cells that are programmed and read simultaneously.

Although the memory pages of array 320 typically have the same number of cells, their capacity (i.e. the amount of information that they can reliably store) may vary from page to page and over time. Generally, the capacity of each memory page 324 may be smaller than, equal to or greater than P. MSP 52 allocates one or more of the memory pages to function as excess capacity pages 328, which are used for storing excess bits of other memory pages whose capacity is smaller than P. In the present example, array 320 comprises thirty-two memory pages, of which one page serves as an excess capacity page.

When the MSP accepts a controller page having P bits for storage, it assesses the capacity of the next-available memory page 324, denoted Cn. If C>P (i.e., the capacity of the next-available memory page is sufficient for storing the P bits of the controller page), the MSP stores the P bits in the memory page. If the capacity of the next-available memory page is not sufficient for storing the P bits of the controller page, i.e., when Cn≦P, the MSP stores Cn bits out of the P bits of the controller page in the memory page, and stores the remaining P−Cn bits in unused memory cells of excess capacity pages 328.

Note that writing or reading a page using the method described above may involve two page write or read operations. In some embodiments, the MSP may cache some or all of the excess capacity pages, or portions of these pages, in a RAM or other cache memory. By caching excess capacity pages, the MSP can reduce the number of dual-read and dual-write operations.

When reading data out of the memory device, the MSP can cache the last read excess capacity bits. When retrieving a memory page, the MSP checks whether the excess bits of the page are present in the cached data. If the desired excess bits are cached, they can be appended to the retrieved memory page without having to physically read the excess capacity page. When writing data into the memory device, the MSP can cache the excess capacity bits and physically store them in the memory device less frequently.

In order to prevent the cached data from being lost in case of voltage failure, the MSP may comprise circuitry that identifies voltage irregularities and rapidly stores the cached data in the memory device when necessary. The memory controller may also instruct the MSP to store the cached data in the memory device using an End Of File (EOF) attribute or other suitable command. The memory controller will typically use this command before switching off power and/or at the end of writing a data file. Further alternatively, the MSP can also store the cached data in the memory after a certain time out.

Figure 16:
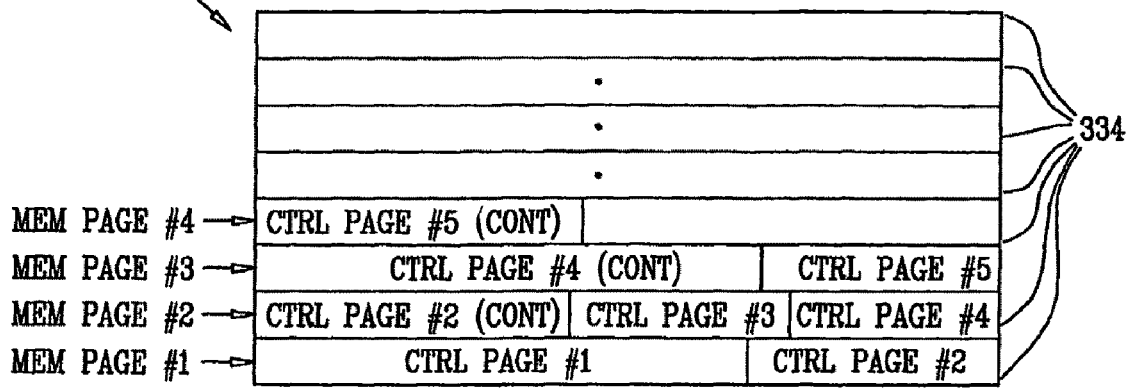

FIG. 16 illustrates an alternative method for efficiently storing fixed-size controller pages in variable-capacity memory pages, in accordance with an embodiment of the present invention. In the method of FIG. 16, MSP 52 stores controller pages (denoted CTRL PAGE #1 . . . #5), each having P bits, in variable-capacity memory pages 334 of a memory array 330. The capacity of each memory page 334 can be smaller than, equal to or greater than P.

MSP 52 stores the controller pages one following the other, regardless of the boundaries of memory pages 334. Thus, a certain memory page may contain data belonging to one or more controller pages, and the data of a certain controller page may be stored in one or more memory pages. The MSP records the location of each controller page in the array, such as by storing the start and end addresses of each controller page. This storage method utilizes the entire capacity of the memory pages, at the expense of some management overhead.

The storage method is typically transparent to the memory controller. When the memory controller requests a certain controller page, the MSP reads the requested controller page from the appropriate memory location and sends the data to the controller. In some cases, such as when storing large data files or digital images, the memory controller sends sequences of successive controller pages for storage. In such cases, the MSP can reduce the number of physical page programming operations by buffering the data accepted from the memory controller. The MSP physically writes the data to the memory array, for example, when the buffer is full, when explicitly instructed by the memory controller (e.g., responsively to an EOF command) or when the memory controller sends a controller page that is not part of the sequence. An exemplary command that can be used for this purpose is the "Page Cache Program" command, which is defined on page 61 of the ONFI specification, cited above. The MSP can also reduce the number of page-read operations required for reading a large amount of data that is stored sequentially in memory by buffering the data read from the memory.

Figure 17:
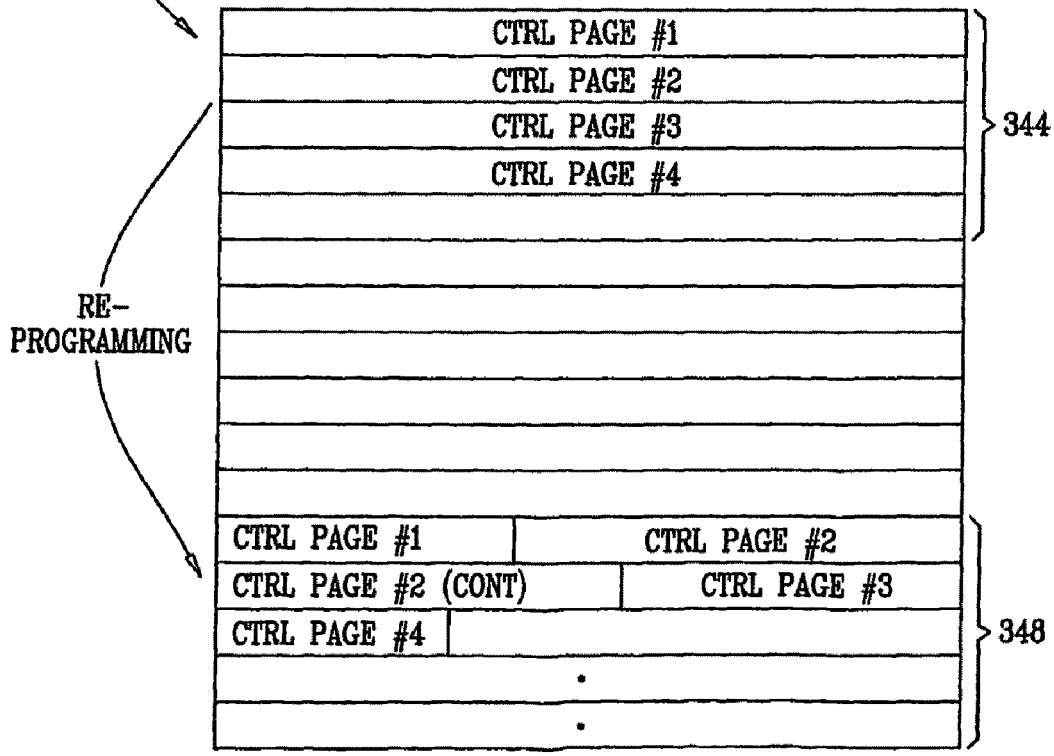

FIG. 17 illustrates yet another method for efficiently storing fixed-size controller pages in variable-capacity memory pages, in accordance with another embodiment of the present invention. In the method of FIG. 17, the MSP writes the controller pages in two stages, in order to increase programming speed.

The memory pages of a memory array 340 are divided into a temporary storage area 344 and a permanent storage area 348. When the MSP accepts the controller pages from the memory controller, it initially writes them into separate memory pages in area 344, such that each controller page is written into a single memory page.

At a later point in time, typically when communication with the memory controller is idle, the MSP re-programs the data into permanent storage area 348. The data in area 348 is stored in the closely-packed, capacity-efficient method of FIG. 16 above. Pages in area 344 that have been re-programmed are freed and can be reused for temporary storage of subsequent controller, pages.

Wear Leveling Considerations

The level of distortion present in a particular page often depends on the number of programming and erasure cycles the page has gone through. Typically, the performance and capacity of a page deteriorates as it goes through an increasing number of programming and erasure cycles. Thus, it is often advantageous to distribute the programming of memory pages, so that performance degradation is distributed evenly across the memory cell array. This feature is referred to as wear leveling, and is described, for example, in "Wear Leveling in Single Level Cell NAND Flash Memories," Application note AN-1822 by STMicroelectronics (Geneva, Switzerland), February, 2007, which is incorporated herein by reference.

When MSP 52 selects a page or group of pages in which to write data, the MSP may select a page or group of pages that have gone through a relatively small number of programming and erasure cycles. Such wear leveling considerations can be used in any of the methods described above.

In some cases, the MSP can select a page based on a metric that combines wear leveling with distortion estimation, such as $$\text{Metric} = \gamma \cdot \text{Number WriteEraseCycles} + \delta \cdot \text{DistortionEstimation}$$

wherein $\gamma$ and $\delta$ denote weighting coefficients. DistortionEstimation denotes the estimated distortion level. For example, DistortionEstimation can be derived by counting the memory cells whose voltage has dropped significantly. Another factor that can be added to the definition of Metric above is the time that passed since the last erase operation of the block (similarly to the equation that defines $I_{Leakage}$ in the description of FIG. 11 above).

Although the embodiments described herein mainly refer to adapting the storage density of multi-level memory cells by modifying the number of voltage levels and ECC scheme, the methods and systems described herein can also be used in single-level cells, by varying only the ECC.

Although the embodiments described herein mainly address retrieving data from solid-state memory devices, the principles of the present invention can also be used for storing and retrieving data in Hard Disk Drives (HDD) and other data storage media and devices. In some storage devices such as HDD and digital cassettes, the storage media is not pre-divided into discrete cells before the data is stored. Rather, the data is stored in regions of the continuous media, and the locations of these regions within the continuous media are defined as part of the storage process itself. In the context of the present patent application and in the claims, such regions, which are defined during the storage process in media that is a-priori continuous, are also considered as "analog memory cells".

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage in a memory that includes a plurality of analog memory cells, the method comprising:

estimating respective achievable storage capacities of the analog memory cells;

assigning the memory cells respective storage configurations defining quantities of data to be stored in the memory cells based on the estimated achievable capacities;

storing the data in the memory cells in accordance with the respective assigned storage configurations;

re-estimating the respective achievable storage capacities of the analog memory cells after the memory has been installed in a host system and used for storing the data in the host system, and modifying the storage configurations responsively to the re-estimated achievable capacities, wherein assigning and modifying the storage configurations comprise maintaining a predetermined margin between the quantities of the data stored in the memory cells and the respective estimated achievable capacities.

2. The method according to claim 1, wherein storing the data comprises encoding the data using an Error Correcting Code (ECC), converting the encoded data to analog values selected from a set of nominal analog values and writing the analog values into the respective memory cells, and wherein each storage configuration specifies a respective ECC code rate and a size of a set of nominal analog values used for storing the data.

3. The method according to claim 1, wherein, for each analog memory cell, storing the data comprises converting the data to analog values selected from a set of nominal analog values and writing the analog values into the memory cell, and wherein each storage configuration specifies the nominal analog values used for storing the data in the analog memory cell.

4. The method according to claim 1, wherein storing the data comprises converting the data to analog values and writing the analog values into the respective memory cells, and wherein estimating the achievable storage capacities comprises estimating respective distortion levels affecting the analog values written into the memory cells and determining the achievable storage capacities responsively to the distortion levels.

5. The method according to claim 4, wherein estimating the distortion levels comprises reading the analog values from the memory cells and estimating the distortion levels based on the analog values read from the memory cells.

6. The method according to claim 5, wherein estimating the distortion levels comprises reconstructing the data from the analog values read from the memory cells and calculating the distortion levels based on the reconstructed data.

7. The method according to claim 5, wherein calculating the distortion levels comprises summing scalar functions of the analog values read from the memory cells.

8. The method according to claim 7, wherein summing the scalar functions comprises summing squares of differences between the analog values read from the memory cells and respective expected values of the data stored in the memory cells responsively to the data.

9. The method according to claim 6, wherein calculating the distortion levels comprises counting a number of memory cells in which a difference between the analog values read from the memory cells and respective expected values of the data stored in the memory cells responsively to the data exceeds a predetermined value.

10. The method according to claim 4, wherein storing the data comprises writing the analog values into the memory cells and verifying the written analog values using an iterative Program and Verify (P&V) process, and wherein estimating the distortion levels comprises calculating the distortion levels based on the analog values verified by the P&V process.

11. The method according to claim 4, wherein storing the data comprises writing the analog values into the memory cells and verifying the written analog values using an iterative Program and Verify (P&V) process, which iteratively increments the analog values by a programming step, and wherein the storage configurations define a size of the programming step used by the iterative P&V process.

12. The method according to claim 1, wherein storing the data comprises encoding the data to be stored in a group of the memory cells using an Error Correcting Code (ECC) and converting the encoded data to analog values for storage in the respective analog memory cells of the group, wherein estimating the achievable storage capacities comprises reading the analog values from the memory cells in the group and evaluating a distance metric between the read analog values and a valid codeword of the ECC that is nearest to the analog values, and wherein modifying the storage configurations comprises adapting the storage configuration of the group of the memory cells responsively to the evaluated distance metric.

13. The method according to claim 1, wherein re-estimating the achievable storage capacities comprises reading the data stored in the memory cells, and wherein modifying the storage configurations comprises adapting the storage configurations responsively to detecting errors in the read data.

14. The method according to claim 13, wherein storing the data comprises encoding the data using an Error Correcting Code (ECC), and wherein adapting the storage configurations comprises modifying a code rate of the ECC.

15. The method according to claim 1, wherein estimating the achievable capacities of the memory cells comprises tracking previous programming and erasure operations applied to the respective memory cells and estimating the achievable capacities responsively to the tracked previous programming and erasure operations.

16. The method according to claim 15, wherein estimating the achievable capacities comprises calculating the achievable capacities responsively to lengths of time periods that elapsed since the previous programming and erasure operations.

17. The method according to claim 1, wherein storing the data comprises converting an initial portion of the data to analog values and writing the analog values into the respective memory cells, and subsequently storing an additional portion of the data in at least some of the memory cells by increasing the analog values written to the memory cells without erasing the cells.

18. The method according to claim 1, wherein storing the data comprises encoding the data using an Error Correcting Code (ECC) that adds redundancy bits to the data and storing the redundancy bits in some of the analog memory cells, and wherein modifying the storage configurations comprises modifying a number of the redundancy bits added by the ECC without erasing the cells.

19. The method according to claim 18, wherein storing the redundancy bits comprises storing the redundancy bits separately from the data.

20. The method according to claim 1, wherein assigning the storage configurations comprises predefining a set of possible storage configurations, and wherein modifying the storage configurations comprises selecting updated storage configurations from the predefined set.

21. The method according to claim 1, wherein the quantity of the data defined by at least one of the storage configurations specifies a non-integer number of bits per cell.

22. The method according to claim 1, wherein storing the data comprises compressing the data before writing the data to the memory cells, and wherein the storage configurations define respective compression ratios by which the data is to be compressed.

23. The method according to claim 1, wherein assigning the storage configurations comprises defining the storage configurations for respective groups of the memory cells.

24. The method according to claim 1, wherein storing the data in the memory cells comprises accepting a data item for storage in the memory, selecting a subset of the memory cells in which to store the data item responsively to the assigned storage configurations, and storing the data item in the selected subset of the memory cells.

25. The method according to claim 1, wherein re-estimating the achievable storage capacities is performed during idle time periods in which the data is not stored and read.

26. The method according to claim 1, wherein assigning and modifying the storage configurations comprise storing the storage configurations in a configuration table.

27. The method according to claim 26, and comprising storing initial values of the storage configurations in the configuration table before the memory has been installed in the host system.

28. The method according to claim 1, wherein at least some of the distortion is caused by leakage current in the analog memory cells, and wherein estimating the distortion comprises estimating the leakage current.

29. A method for data storage in a memory that includes a plurality of analog memory cells, the method comprising:
tracking respective achievable storage capacities of the analog memory cells while the memory is in use in a host system;
accepting data for storage in the memory; selecting a subset of the memory cells for storing the data based on the tracked achievable capacities; and
storing the data in the memory cells of the subset,
wherein accepting the data for storage comprises accepting the data in fixed-capacity blocks from the host system and storing the data in variable-capacity groups of the memory cells based on the tracked achievable capacities of variable-size groups, sequentially and irrespective of boundaries between the variable-capacity groups.

30. The method according to claim 29, wherein selecting the subset comprises selecting the memory cells whose aggregate achievable capacity best matches a size of the accepted data.

31. The method according to claim 29, wherein accepting the data comprises accepting a requested reliability level for storing the data, and wherein selecting the subset comprises selecting the memory cells responsively to the requested reliability level.

32. The method according to claim 29, wherein accepting the data comprises accepting a requested retention period for storing the data, and wherein selecting the subset comprises selecting the memory cells responsively to the requested retention period.

33. The method according to claim 29, wherein selecting the subset comprises selecting the memory cells having low distortion levels with respect to other memory cells.

34. The method according to claim 29, wherein tracking the achievable storage capacities comprises tracking previous programming and erasure operations applied to the memory cells, and wherein selecting the subset comprises selecting the memory cells responsively to the previous programming and erasure operations.

35. The method according to claim 34, wherein selecting the subset comprises distributing a number of programming and erasure operations evenly over the memory cells in the memory by selecting the memory cells having a smaller number of the previous programming and erasure operations with respect to other memory cells.

36. The method according to claim 35, wherein distributing the number of programming and erasure operations comprises selecting the memory cells having the smaller number of the previous programming and erasure operations performed during a predetermined recent time period with respect to the other memory cells.

37. The method according to claim 29, wherein tracking the achievable storage capacities comprises calculating and reporting to the host system a size of an available memory space by summing the achievable capacities of the memory cells that are available for storing the data.

38. The method according to claim 29, wherein the memory is divided into multiple erasure blocks, each erasure block comprising a group of the memory cells that are erased in a single erasure operation, and comprising erasing a data item from the memory by:
  identifying one or more of the erasure blocks in which the data item is stored;
  when the erasure blocks in which the data item is stored contain stored data of another data item, identifying alternative memory cells outside the erasure blocks in which the data item is stored based on the tracked achievable capacities of the memory cells and on a size of the other data item, and copying the data of the other data item to the alternative memory cells; and
  erasing the erasure blocks in which the data item is stored.

39. The method according to claim 29, wherein storing the data in the variable-capacity groups comprises identifying two or more variable-capacity groups having capacities that are smaller than a capacity of the fixed-capacity block, and storing the data accepted in one or more of the fixed-capacity blocks in the identified two or more variable-capacity groups.

40. The method according to claim 29, wherein storing the data in the variable-capacity groups comprises allocating one or more of the variable-capacity groups to serve as an excess memory storage area, storing the data accepted in the fixed-capacity blocks in respective variable-capacity groups, and, when the achievable capacity of a variable-capacity group is smaller than a capacity of the fixed-capacity blocks, storing some of the data accepted in the respective fixed-capacity block in the allocated excess memory storage area.

41. The method according to claim 29, wherein storing the data comprises initially storing the data accepted in each fixed-capacity block in a respective variable-capacity group, and subsequently re-programming the initially-stored data sequentially, irrespective of the boundaries between the variable-capacity groups.

42. The method according to claim 29, and comprising retrieving the data from the variable-size groups, reconstructing the fixed-size blocks and outputting the data using the fixed-size blocks to the host system.

43. The method according to claim 29, and comprising reducing a number of memory access operations applied to the memory by caching at least some of the data.

44. The method according to claim 43, wherein caching the at least some of the data comprises transferring the cached data to the memory upon detecting an immediate storage event.

45. A method for data storage in a memory that includes a plurality of analog memory cells, the method comprising:
  tracking respective achievable storage capacities of the analog memory cells while the memory is in use in a host system;
  accepting data for storage in the memory;
  selecting a subset of the memory cells for storing the data based on the tracked achievable capacities;
  storing the data in the memory cells of the subset; and
  reducing a number of memory access operations applied to the memory by caching at least some of the data, wherein caching the at least some of the data comprises transferring the cached data to the memory upon detecting an immediate storage event, comprising at least one event selected from a group of events consisting of an approaching power failure, a time out and an End Of File (EOF) command accepted from the host system.

46. Data storage apparatus, comprising:
  an interface, which is arranged to communicate with a memory that includes a plurality of analog memory cells; and
  a memory signal processor (MSP), which is arranged to estimate respective achievable storage capacities of the memory cells, to assign the memory cells respective storage configurations defining quantities of data to be stored in the memory cells based on the estimated achievable capacities, to store the data in the memory cells in accordance with the respective assigned storage configurations, to re-estimate the respective achievable storage capacities of the analog memory cells after the memory has been installed in a host system and used for storing the data in the host system, and to modify the storage configurations responsively to the re-estimated achievable capacities.

47. The apparatus according to claim 46, wherein the MSP is arranged to encode the data using an Error Correcting Code (ECC), to convert the encoded data to analog values selected from a set of nominal analog values and to write the analog values into the respective memory cells, and wherein each storage configuration specifies a respective ECC code rate and a size of a set of nominal analog values used for storing the data.

48. The apparatus according to claim 46, wherein, for each analog memory cell, the MSP is arranged to store the data by converting the data to analog values selected from a set of nominal analog values and writing the analog values into the memory cell, and wherein each storage configuration specifies the nominal analog values used for storing the data in the analog memory cell.

49. The apparatus according to claim 46, wherein the MSP is arranged to convert the data to analog values and to write the analog values into the respective memory cells, to estimate respective distortion levels affecting the analog values written into the memory cells and to determine the achievable storage capacities responsively to the distortion levels.

50. The apparatus according to claim 49, wherein the MSP is arranged to read the analog values from the memory cells and to estimate the distortion levels based on the analog values read from the memory cells.

51. The apparatus according to claim 50, wherein the MSP is arranged to reconstruct the data from the analog values read from the memory cells, and to calculate the distortion levels based on the reconstructed data.

52. The apparatus according to claim 51, wherein the MSP is arranged to calculate the distortion levels by summing scalar functions of the analog values read from the memory cells.

53. The apparatus according to claim 52, wherein the MSP is arranged to sum squares of differences between the analog values read from the memory cells and respective expected values of the data stored in the memory cells responsively to the data.

54. The apparatus according to claim 52, wherein the MSP is arranged to calculate the distortion levels by counting a number of memory cells in which a difference between the analog values read from the memory cells and respective expected values of the data stored in the memory cells responsively to the data exceeds a predetermined value.

55. The apparatus according to claim 49, wherein the MSP is arranged to write the analog values into the memory cells and verify the written analog values using an iterative Program and Verify (P&V) process, and to calculate the distortion levels based on the analog values verified by the P&V process.

56. The apparatus according to claim 49, wherein the MSP is arranged to write the analog values into the memory cells and verify the written analog values using an iterative Program and Verify (P&V) process, which iteratively increments the analog values by a programming step, and wherein the storage configurations define a size of the programming step used by the iterative P&V process.

57. The apparatus according to claim 46, wherein the MSP is arranged to encode the data to be stored in a group of the memory cells using an Error Correcting Code (ECC), to convert the encoded data to analog values for storage in the respective analog memory cells of the group, to read the analog values from the memory cells in the group, to evaluate a distance metric between the read analog values and a valid codeword of the ECC that is nearest to the analog values and to adapt the storage configuration of the group of the memory cells responsively to the evaluated distance metric.

58. The apparatus according to claim 46, wherein the MSP is arranged to read the data stored in the memory cells and to modify the storage configurations responsively to detecting errors in the read data.

59. The apparatus according to claim 58, wherein the MSP is arranged to encode the data using an Error Correcting Code (ECC), and to modify the storage configurations by modifying a code rate of the ECC.

60. The apparatus according to claim 46, wherein the MSP is arranged to track previous programming and erasure operations applied to the memory cells and to estimate the respective achievable capacities responsively to the tracked previous programming and erasure operations.

61. The apparatus according to claim 60, wherein the MSP is arranged to calculate the achievable capacities responsively to lengths of time periods that elapsed since the previous programming and erasure operations.

62. The apparatus according to claim 46, wherein the MSP is arranged to convert an initial portion of the data to analog values and write the analog values into the respective memory cells, and to subsequently store an additional portion of the data in the memory cells by increasing the analog values written to at least some of the memory cells without erasing the cells.

63. The apparatus according to claim 46, wherein the MSP is arranged to encode the data using an Error Correcting Code (ECC) that adds redundancy bits to the data and storing the redundancy bits in some of the analog memory cells, and to modify the storage configurations by modifying a number of the redundancy bits added by the ECC without erasing the cells.

64. The apparatus according to claim 63, wherein the MSP is arranged to store the redundancy bits separately from the data.

65. The apparatus according to claim 46, wherein the MSP is arranged to modify the storage configurations by selecting updated storage configurations from a predefined set of possible storage configurations.

66. The apparatus according to claim 46, wherein the quantity of the data defined by at least one of the storage configurations specifies a non-integer number of bits per cell.

67. The apparatus according to claim 46, wherein the MSP is arranged to compress the data before writing the data to the memory cells, and wherein the storage configurations define respective compression ratios by which the data is to be compressed.

68. The apparatus according to claim 46, wherein the MSP is arranged to define the storage configurations for respective groups of the memory cells.

69. The apparatus according to claim 46, wherein the MSP is arranged to accept a data item for storage in the memory, to select a subset of the memory cells in which to store the data item responsively to the assigned storage configurations, and to store the data item in the selected subset of the memory cells.

70. The apparatus according to claim 46, wherein the MSP is arranged to re-estimate the achievable storage capacities during idle time periods in which the data is not stored and read.

71. The apparatus according to claim 46, wherein the MSP is arranged to store the storage configurations in a configuration table.

72. The apparatus according to claim 46, wherein the MSP is arranged to maintain a predetermined margin between the quantities of the data stored in the memory cells and the respective estimated achievable capacities.

73. The apparatus according to claim 46, wherein at least some distortion affecting the analog values written into the memory cells is caused by leakage current in the analog memory cells, and wherein the MSP is arranged to estimate the leakage current.

74. Data storage apparatus, comprising:
an interface, which is arranged to communicate with a memory that includes a plurality of analog memory cells; and
a memory signal processor (MSP), which is arranged to track respective achievable storage capacities of the memory cells while the memory is in use in a host system, to accept data for storage in the memory, to select a subset of the memory cells for storing the data based on the tracked achievable capacities, and to store the data in the memory cells of the subset,
wherein the MSP is arranged to accept the data from the host system in fixed-capacity blocks and to store the data in variable-capacity groups of the memory cells based on the tracked achievable capacities of variable-size groups, sequentially and irrespective of boundaries between the variable-capacity groups.

75. The apparatus according to claim 74, wherein the MSP is arranged to select the memory cells whose aggregate achievable capacity best matches a size of the accepted data.

76. The apparatus according to claim 74, wherein the MSP is arranged to accept a requested reliability level for storing the data and to select the memory cells responsively to the requested reliability level.

77. The apparatus according to claim 74, wherein the MSP is arranged to accept a requested retention period for storing the data and to select the memory cells responsively to the requested retention period.

78. The apparatus according to claim 74, wherein the MSP is arranged to select the memory cells having low distortion levels with respect to other memory cells.

79. The apparatus according to claim 74, wherein the MSP is arranged to track previous programming and erasure operations applied to the memory cells and to select the memory cells responsively to the previous programming and erasure operations.

80. The apparatus according to claim 79, wherein the MSP is arranged to distribute a number of programming and erasure operations evenly over the memory cells in the memory by selecting the memory cells having a smaller number of the previous programming and erasure operations with respect to other memory cells.

81. The apparatus according to claim 80, wherein the MSP is arranged to select the memory cells having the smaller number of the previous programming and erasure operations performed during a predetermined recent time period with respect to the other memory cells.

82. The apparatus according to claim 74, wherein the MSP is arranged to calculate and report to the host system a size of an available memory space by summing the achievable capacities of the memory cells that are available for storing the data.

83. The apparatus according to claim 74, wherein the memory is divided into multiple erasure blocks, each erasure block comprising a group of the memory cells that are erased in a single erasure operation, and wherein the MSP is arranged to erase a data item from the memory by:
identifying one or more of the erasure blocks in which the data item is stored;
when the erasure blocks in which the data item is stored contain stored data of another data item, identifying alternative memory cells outside the erasure blocks in which the data item is stored based on the tracked achievable capacities of the memory cells and on a size of the other data item, and copying the data of the other data item to the alternative memory cells; and
erasing the erasure blocks in which the data item is stored.

84. The apparatus according to claim 74, wherein the MSP is arranged to identify two or more variable-capacity groups having capacities that are smaller than a capacity of the fixed-capacity block, and to store the data accepted in one or more of the fixed-capacity blocks in the identified two or more variable-capacity groups.

85. The apparatus according to claim 74, wherein the MSP is arranged to allocate one or more of the variable-capacity groups to serve as an excess memory storage area, to store the data accepted in the fixed-capacity blocks in respective variable-capacity groups, and, when the achievable capacity of a variable-capacity group is smaller than a capacity of the fixed-capacity blocks, to store some of the data accepted in the respective fixed-capacity block in the allocated excess memory storage area.

86. The apparatus according to claim 74, wherein the MSP is arranged to initially store the data accepted in each fixed-capacity block in a respective variable-capacity group, and to subsequently re-program the initially-stored data sequentially, irrespective of the boundaries between the variable-capacity groups.

87. The apparatus according to claim 74, wherein the MSP is arranged to retrieve the data from the variable-size groups, to reconstruct the fixed-size blocks and to output the data using the fixed-size blocks to the host system.

88. The apparatus according to claim 74, wherein the MSP is arranged to reduce a number of memory access operations applied to the memory by caching at least some of the data.

89. The apparatus according to claim 88, wherein the MSP is arranged to transfer the cached data to the memory upon detecting an immediate storage event.

90. Data storage apparatus, comprising:
an interface, which is arranged to communicate with a memory that includes a plurality of analog memory cells; and
a memory signal processor (MSP), which is arranged to track respective achievable storage capacities of the memory cells while the memory is in use in a host system, to accept data for storage in the memory, to select a subset of the memory cells for storing the data based on the tracked achievable capacities, and to store the data in the memory cells of the subset,
wherein the MSP is arranged to reduce a number of memory access operations applied to the memory by caching at least some of the data, and to transfer the cached data to the memory upon detecting an immediate storage event comprising at least one event selected from a group of events consisting of an approaching power failure, a time out and an End Of File (EOF) command accepted from the host system.

91. Data storage apparatus, comprising:
a memory, which comprises a plurality of analog memory cells; and
a memory signal processor (MSP), which is coupled to the memory and is arranged to estimate respective achievable storage capacities of the memory cells, to assign the memory cells respective storage configurations defining quantities of data to be stored in the memory cells based on the estimated achievable capacities, to store the data in the memory cells in accordance with the respective assigned storage configurations, to re-estimate the respective achievable storage capacities of the analog memory cells after the memory has been installed in a host system and used for storing the data in the host system, and to modify the storage configurations responsively to the re-estimated achievable capacities.

92. The apparatus according to claim 91, wherein the memory resides in a first Integrated Circuit (IC) and wherein the MSP resides in a second IC different from the first IC.

93. The apparatus according to claim 91, wherein the memory and the MSP are integrated in a single device.

94. The apparatus according to claim 91, wherein the MSP is embodied in a processor of the host system.

95. The apparatus according to claim 91, wherein the memory cells comprise Flash memory cells.

96. The apparatus according to claim 91, wherein the memory cells comprise Dynamic Random Access Memory (DRAM) cells.

97. The apparatus according to claim 91, wherein the memory cells comprise Phase Change Memory (PCM) cells.

98. The apparatus according to claim 91, wherein the memory cells comprise Nitride Read-Only Memory (NROM) cells.

99. The apparatus according to claim 91, wherein the memory cells comprise Magnetic Random Access Memory (MRAM) cells.

100. The apparatus according to claim 91, wherein the memory cells comprise Ferroelectric Random Access Memory (FRAM) cells.

101. Data storage apparatus, comprising:
a memory, which comprises a plurality of analog memory cells; and
a memory signal processor (MSP), which is coupled to the memory and is arranged to track respective achievable storage capacities of the memory cells while the memory is in use in a host system, to accept data for storage in the memory, to select a subset of the memory cells for storing the data based on the tracked achievable capacities, and to store the data in the memory cells of the subset,
wherein the MSP is arranged to accept the data from the host system in fixed-capacity blocks and to store the data in variable-capacity groups of the memory cells based on the tracked achievable capacities of variable-size groups, sequentially and irrespective of boundaries between the variable-capacity groups.

102. The apparatus according to claim 101, wherein the memory resides in a first Integrated Circuit (IC) and wherein the MSP resides in a second IC different from the first IC.

103. The apparatus according to claim 101, wherein the memory and the MSP are integrated in a single device.

104. The apparatus according to claim 101, wherein the MSP is embodied in a processor of the host system.

105. The apparatus according to claim 101, wherein the memory cells comprise Flash memory cells.

106. The apparatus according to claim 101, wherein the memory cells comprise Dynamic Random Access Memory (DRAM) cells.

107. The apparatus according to claim 101, wherein the memory cells comprise Phase Change Memory (PCM) cells.

108. The apparatus according to claim 101, wherein the memory cells comprise Nitride Read-Only Memory (NROM) cells.

109. The apparatus according to claim 101, wherein the memory cells comprise Magnetic Random Access Memory (MRAM) cells.

110. The apparatus according to claim 101, wherein the memory cells comprise Ferroelectric Random Access Memory (FRAM) cells.

* * * * *